(12) United States Patent
Jang

(10) Patent No.: US 8,724,771 B2
(45) Date of Patent: May 13, 2014

(54) SHIFT REGISTER

(71) Applicant: LG Display Co., Ltd., Seoul (KR)

(72) Inventor: Yong-Ho Jang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/727,230

(22) Filed: Dec. 26, 2012

(65) Prior Publication Data

US 2014/0093027 A1 Apr. 3, 2014

(30) Foreign Application Priority Data

Sep. 28, 2012 (KR) .................. 10-2012-0108832

(51) Int. Cl.
*G11C 19/00* (2006.01)

(52) U.S. Cl.
USPC .................................. 377/64; 377/78; 377/79

(58) Field of Classification Search
None
See application file for complete search history.

(56) References Cited

U.S. PATENT DOCUMENTS

| | | | |
|---|---|---|---|
| 2006/0210012 A1* | 9/2006 | Yamaguchi et al. ............ | 377/64 |
| 2008/0055225 A1* | 3/2008 | Pak et al. ........................ | 345/96 |
| 2012/0105338 A1* | 5/2012 | Lin et al. ........................ | 345/173 |
| 2013/0249884 A1* | 9/2013 | Kim et al. ...................... | 345/212 |
| 2013/0301793 A1* | 11/2013 | Tobita ............................. | 377/64 |

FOREIGN PATENT DOCUMENTS

| | | |
|---|---|---|
| KR | 1020090050358 A | 5/2009 |
| KR | 1020100006065 A | 1/2010 |
| KR | 1020110031748 A | 3/2011 |
| KR | 1020120096390 A | 8/2012 |

OTHER PUBLICATIONS

Office Action issued in corresponding Korean Patent Application No. 10-2012-0108832, mailed Nov. 30, 2013, 5 pages.

* cited by examiner

*Primary Examiner* — Tuan T Lam
(74) *Attorney, Agent, or Firm* — Brinks Gilson & Lione

(57) ABSTRACT

A shift register includes a plurality of stages, each of which outputs a carry pulse and a scan pulse. An nth one of the stages includes a carry output switching device controlled by a voltage applied to a set node and connected between a carry clock transfer line transferring any one of i carry clock pulses and a carry output terminal of the nth stage, a scan output switching device controlled by the voltage applied to the set node and connected between a scan clock transfer line transferring any one of j scan clock pulses and a scan output terminal of the nth stage, and a stabilization switching device controlled by any one of the i carry clock pulses and connected between a carry output terminal of an (n−p)th one of the stages and the set node or between a start transfer line and the set node.

23 Claims, 21 Drawing Sheets

SHIFT REGISTER

This application claims the benefit of Korean Patent Application No. 10-2012-0108832 filed on Sep. 28, 2012 which is hereby incorporated by reference as if fully set forth herein.

BACKGROUND

1. Field of the Disclosure

The present disclosure relates to a shift register, and more particularly, to a shift register which is capable of preventing leakage of charges at a set node which occurs when the duty ratio of a scan pulse is small, so as to normally output the scan pulse.

2. Discussion of the Related Art

A shift register outputs a plurality of scan pulses in order to sequentially drive gate lines of a display device, such as a liquid crystal display.

A scan pulse has a duty ratio that can be set appropriately according to a given driving condition. In particular, when the duty ratio of the scan pulse is smaller, a duration in which the scan pulse is kept low (referred to hereinafter as a low duration) is longer. As a result, in this low duration, the possibility that charges at a set node of a stage will be leaked is higher. For this reason, there may occur a problem that the scan pulse is not normally output in an output period of the stage.

SUMMARY

A shift register includes a plurality of stages, each of the stages outputting a carry pulse and a scan pulse, wherein an nth one of the stages (where n is a natural number) includes a carry output switching device controlled by a voltage applied to a set node and connected between a carry clock transfer line, the carry clock transfer line transferring any one of i carry clock pulses having different phases (where i is a natural number greater than 1), and a carry output terminal of the nth stage, a scan output switching device controlled by the voltage applied to the set node and connected between a scan clock transfer line, the scan clock transfer line transferring any one of j scan clock pulses having different phases (where j is a natural number greater than 1), and a scan output terminal of the nth stage, and a stabilization switching device controlled by any one of the i carry clock pulses overlapping with the scan clock pulse applied to the scan output switching device and connected between a carry output terminal of an (n−p)th one of the stages (where p is a natural number less than n) and the set node or between a start transfer line, the start transfer line transferring a start pulse, and the set node.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLY EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
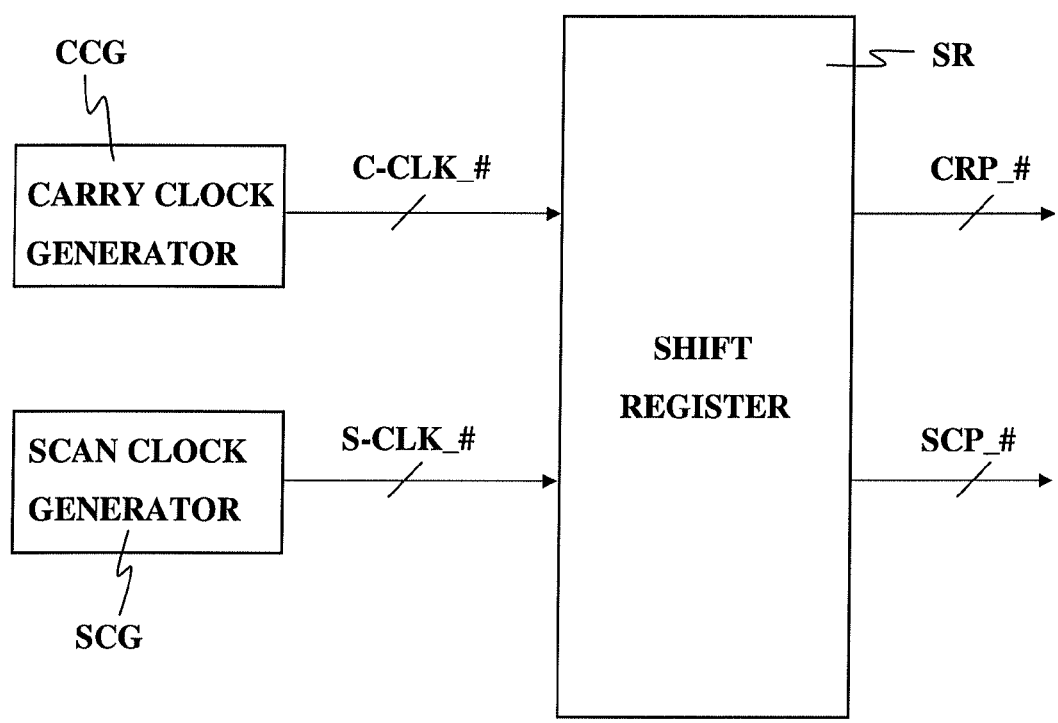
FIG. 1 is a block diagram showing the configuration of a gate driving circuit according to an embodiment of the present invention.
Figure 2:
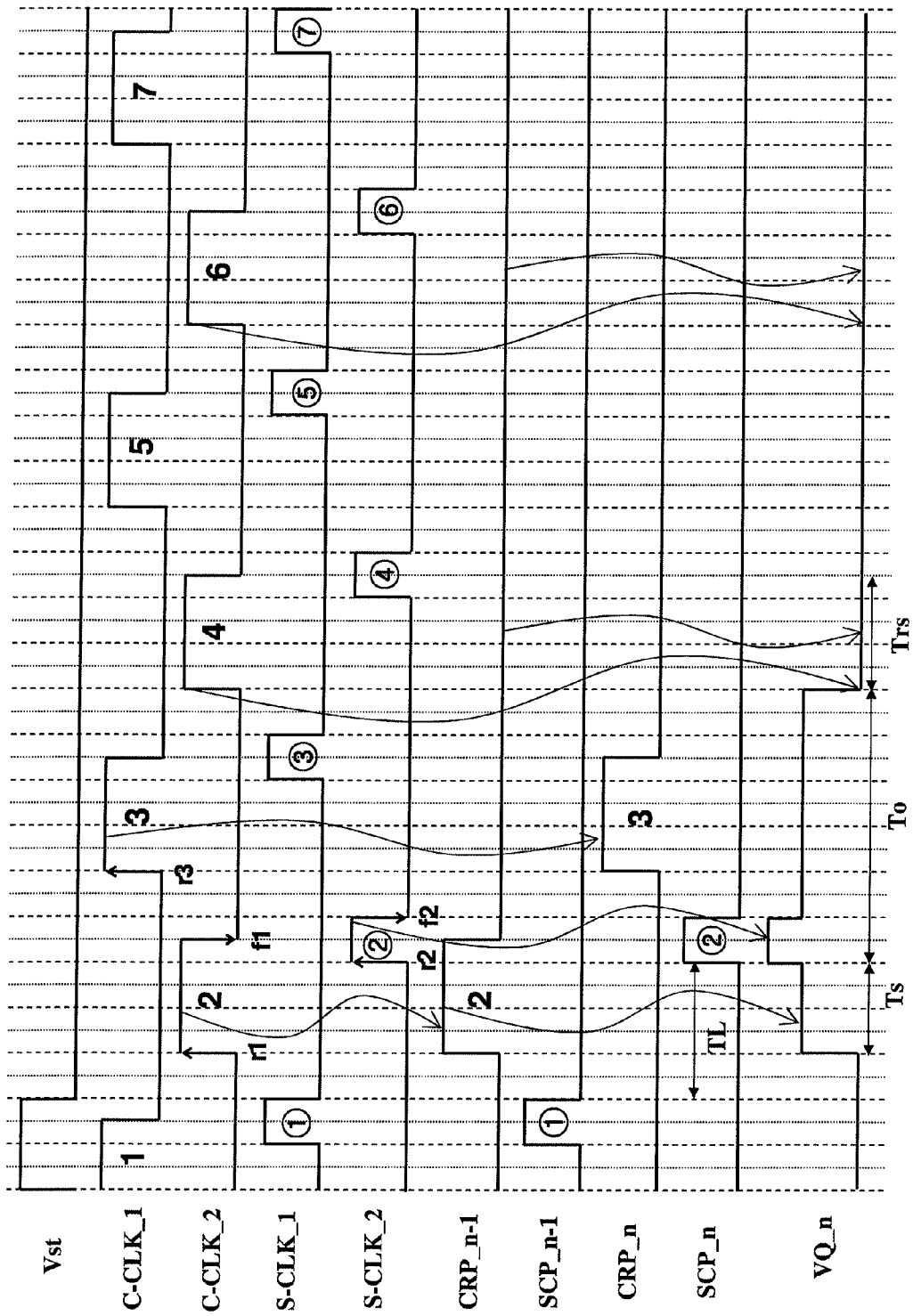
FIG. 2 is an output timing diagram illustrating various signals including carry clock pulses and scan clock pulses of one example output from a carry clock generator and a scan clock generator in FIG. 1.

FIG. 1 is a block diagram showing the configuration of a gate driving circuit according to an embodiment of the present invention, and FIG. 2 is an output timing diagram illustrating various signals including carry clock pulses and scan clock pulses of one example output from a carry clock generator and a scan clock generator in FIG. 1.

The gate driving circuit according to the present embodiment includes a carry clock generator CCG, a scan clock generator SCG, and a shift register SR, as shown in FIG. 1.

The carry clock generator CCG sequentially outputs i carry clock pulses C-CLK_# (where i is a natural number greater than 1). That is, this carry clock generator CCG outputs carry clock pulses of i phases. Each of the i carry clock pulses C-CLK_# consists of a plurality of carry impulses which are periodically output. For example, FIG. 2 shows carry clock pulses C-CLK_1 and C-CLK_2 of two phases, in which the first carry clock pulse C-CLK_1 is ahead in phase of the second carry clock pulse C-CLK_2. The first carry clock pulse C-CLK_1 includes a plurality of carry impulses 1, 3, 5, . . . which are periodically output, and the second carry clock pulse C-CLK_2 likewise includes a plurality of carry impulses 2, 4, 6, . . . which are periodically output. The carry clock generator CCG may output carry clock pulses of three or more phases.

The scan clock generator SCG sequentially outputs j scan clock pulses S-CLK_# (where j is a natural number greater than 1). That is, this scan clock generator SCG outputs scan clock pulses of j phases. Each of the j scan clock pulses S-CLK_# consists of a plurality of scan impulses which are periodically output. For example, FIG. 2 shows scan clock pulses S-CLK_1 and S-CLK_2 of two phases, in which the first scan clock pulse S-CLK_1 is ahead in phase of the second scan clock pulse S-CLK_2. The first scan clock pulse S-CLK_1 includes a plurality of scan impulses ①, ③, ⑤, . . . which are periodically output, and the second scan clock pulse S-CLK_2 likewise includes a plurality of scan impulses ②, ④, ⑥, . . . which are periodically output. The scan clock generator SCG may output scan clock pulses of three or more phases.

As shown in FIG. 2, the i carry clock pulses C-CLK_# are output without overlap in their pulse widths, and the j scan clock pulses S-CLK_# are output without overlap in their pulse widths.

On the other hand, a carry impulse (for example, 1) may have a duration set to be longer than that of a scan impulse (for example, ①), as shown in FIG. 2.

The shift register SR includes a plurality of stages for receiving the i carry clock pulses C-CLK_# from the carry clock generator CCG and the j scan clock pulses S-CLK_# from the scan clock generator SCG and sequentially generating a plurality of outputs.

An output generated from each stage consists of a pair of carry pulse and scan pulse corresponding to each other. In the pair of carry pulse and scan pulse, the carry pulse is supplied to at least one of a downstream stage and an upstream stage, whereas the scan pulse is supplied to a corresponding gate line. Here, in the pair of carry pulse and scan pulse, the carry pulse and the scan pulse may have different durations. In detail, the duration of the carry pulse may be set to be longer than the duration of the scan pulse.

In order to generate the above output, each stage includes a carry output switching device and a scan output switching device.

The carry output switching device outputs the carry pulse to drive at least one of the downstream stage and upstream stage.

The scan output switching device outputs the scan pulse to drive the corresponding gate line.

Each stage receives at least one of the i carry clock pulses which are out of phase with one another, and at least one of the j scan clock pulses which are out of phase with one another.

The carry output switching device of each stage generates and outputs the carry pulse based on the at least one carry clock pulse.

The scan output switching device of each stage generates and outputs the scan pulse based on the at least one scan clock pulse.

The scan impulses included in each of the j scan clock pulses overlap with carry impulses included in at least one carry clock pulse, respectively. In detail, each scan impulse in a scan clock pulse output in the kth order (where k is any one of natural numbers from 1 to j), among the j scan clock pulses, overlaps with a carry impulse output in the (jm+k)th order (where m is a natural number including 0), among the carry impulses in the i carry clock pulses. A more detailed description will hereinafter be given with reference to an example.

That is, assuming that i and j are both set to 2 as shown in FIG. 2, the above expression 'jm+k' is defined as '2m+k', where k is any one of natural numbers from 1 to 2. In this case, the scan clock pulse S-CLK_1 output in the first order (i.e., k=1), of the two (two-phase) scan clock pulses, overlaps with a carry impulse output in the '(2m+1)th' order. In other words, the scan clock pulse S-CLK_1 output in the first order includes the scan impulses ①, ③, ⑤, . . . , which overlap with the carry impulses 1, 3, 5, . . . sequentially output in the odd-numbered order, respectively.

In the same manner, the scan clock pulse S-CLK_2 output in the second order (i.e., k=2), of the two scan clock pulses, overlaps with a carry impulse output in the '(2m+2)th' order. In other words, the scan clock pulse S-CLK_2 output in the second order includes the scan impulses ②, ④, ⑥, . . . , which overlap with the carry impulses 2, 4, 6, . . . sequentially output in the even-numbered order, respectively.

Accordingly, when i and j are both 2 (i.e., when the carry clock pulses and the scan clock pulses are both of two phases), the scan impulses included in the first scan clock pulse S-CLK_1 are output in such a manner that they overlap with the carry impulses included in the first carry clock pulse C-CLK_1, respectively, and the scan impulses included in the second scan clock pulse S-CLK_2 are output in such a manner that they overlap with the carry impulses included in the second carry clock pulse C-CLK_2, respectively.

Particularly, for an ath carry impulse and a bth scan impulse overlapping with each other, the bth scan impulse may have a rising edge positioned between the rising edge and falling edge of the ath carry impulse. Also, the bth scan impulse may have a falling edge positioned between the rising edge of the bth scan impulse and the rising edge of an (a+1)th carry impulse.

As an example, assuming that the ath carry impulse is 2 in FIG. 2, the bth scan impulse is ② in FIG. 2 and the (a+1)th carry impulse is 3 in FIG. 2, the rising edge r2 of the bth scan impulse ② may be positioned between the rising edge r1 and falling edge f1 of the ath carry impulse 2, as shown in FIG. 2. Also, the falling edge f2 of the bth scan impulse ② may be positioned between the rising edge r2 of the bth scan impulse ② and the rising edge r3 of the (a+1)th carry impulse 3, as shown in FIG. 2.

As another example, although not shown, both the rising edge r2 and falling edge f2 of the bth scan impulse ② may be positioned between the rising edge r1 and falling edge f1 of the ath carry impulse 2.

On the other hand, the carry impulse and the scan impulse may have the same or different high voltages (high-state voltages). Also, the carry impulse and the scan impulse may have the same or different low voltages (low-state voltages).

Figure 3:
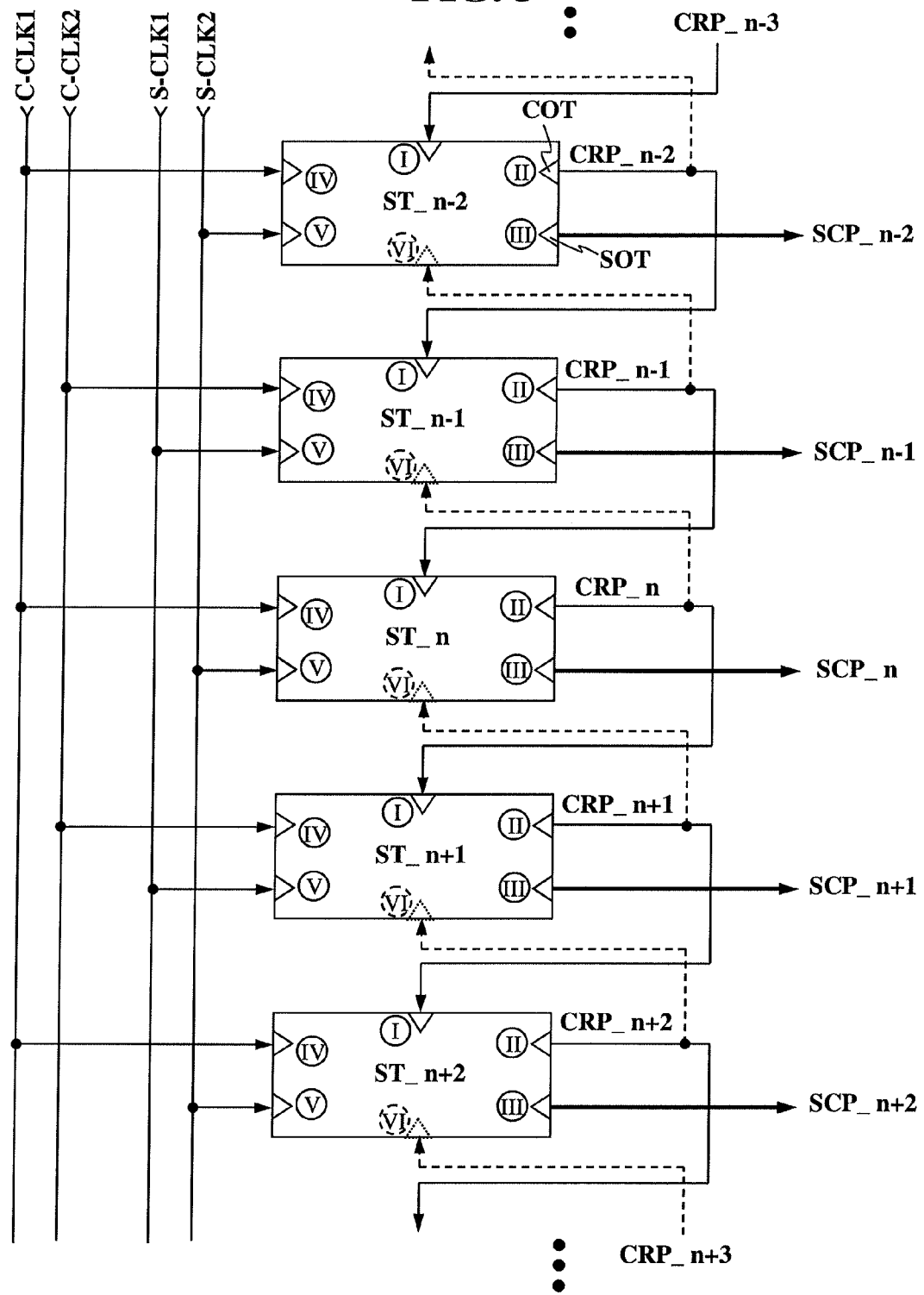
FIG. 3 is a detailed block diagram of a shift register in FIG. 1.

FIG. 3 is a detailed block diagram of the shift register SR in FIG. 1.

The shift register SR according to the present invention includes a plurality of stages ST_n−2 to ST_n+2, as shown in FIG. 3. Here, each stage outputs a carry pulse CRP_n−2 to CRP_n+2 through a number 2 terminal II (referred to hereinafter as a carry output terminal COT) thereof. Also, each stage outputs a scan pulse SCP_n−2 to SCP_n+2 through a number 3 terminal III (referred to hereinafter as a scan output terminal SOT) thereof.

Each stage includes, as shown in FIG. 3, a total of six terminals I, II, III, IV, V and VI, in which the number 1 terminal I is supplied with an output from an upstream stage (or a start pulse Vst), the number 4 terminal IV is supplied with any one carry clock pulse, the number 5 terminal V is supplied with any one scan clock pulse, and the number 6 terminal is supplied with an output from a downstream stage (or the start pulse Vst). On the other hand, the carry pulse and the scan pulse as stated above are independently output through the number 2 terminal II and the number 3 terminal III, respectively.

For example, assuming that n in FIG. 3 is set to an even natural number, the paired first carry clock pulse C-CLK__1 and first scan clock pulse S-CLK__1 may be input respectively to the number 4 terminal IV and number 5 terminal V of an odd-numbered stage (for example, ST_n−1 or ST_n+1 in FIG. 3). In contrast, the paired second carry clock pulse C-CLK__2 and second scan clock pulse S-CLK__2 may be input respectively to the number 4 terminal IV and number 5 terminal V of an even-numbered stage (for example, ST_n−2, ST_n or ST_n+2 in FIG. 3). Also, the converse may be possible.

Each stage controls the operations of a stage downstream therefrom and a stage upstream therefrom using a carry pulse. Also, each stage drives a gate line connected thereto using a scan pulse. On the other hand, although not shown, a dummy stage may further be provided downstream of the last stage to supply a carry pulse to the last stage. According to a given configuration of the shift register SR, the dummy stage may be plural in number, not one in number. Because the dummy stage is not connected to any gate line, it does not output a scan pulse.

Alternatively, according to a given configuration of the shift register SR, each stage may control the operation of only an upstream stage using a carry pulse. On the other hand, although not shown, a dummy stage may further be provided downstream of the last stage to supply a scan pulse to the last stage. According to a given configuration of the shift register SR, the dummy stage may be plural in number, not one in number.

As another alternative, according to a given configuration of the shift register SR, each stage may control the operation of only a downstream stage using a carry pulse.

The first to last stages generate outputs thereof in order from the first stage to the last stage. Each output consists of a carry pulse and a scan pulse, as stated above.

The scan pulses output from the stages other than the dummy stages are sequentially supplied to gate lines of a display panel (not shown) to sequentially scan the gate lines. Also, the carry pulse output from each of the stages is supplied to an upstream stage and a downstream stage.

This shift register SR may be built in the display panel. That is, the display panel has a display region for displaying an image, and a non-display region surrounding the display region, and the shift register SR is built in the non-display region.

Figure 4:
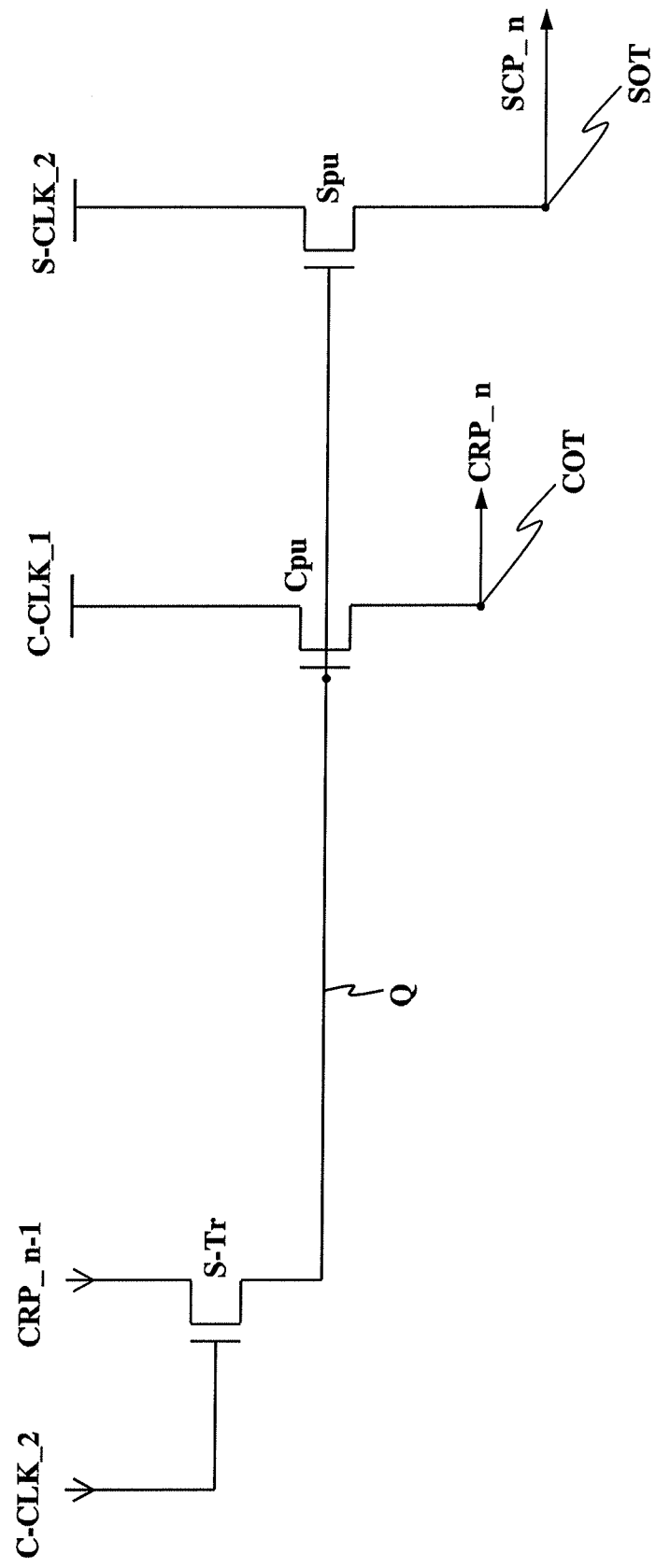
FIG. 4 is a circuit diagram of a first embodiment of an arbitrary stage in FIG. 3.

FIG. 4 is a circuit diagram of a first embodiment of an arbitrary stage in FIG. 3.

The arbitrary stage, for example, the nth stage ST_n includes a set node Q, a carry output terminal COT, a scan output terminal SOT, a carry output switching device Cpu, a scan output switching device Spu, and a stabilization switching device S-Tr, as shown in FIG. 4.

The carry output switching device Cpu of the nth stage ST_n is controlled by a voltage applied to the set node Q and is connected between a carry clock transfer line which transfers any one of the carry clock pulses C-CLK_# of i phases and the carry output terminal COT of the nth stage ST_n. That is, the carry output switching device Cpu is turned on or off in response to the voltage applied to the set node Q, and interconnects the carry clock transfer line and the carry output terminal COT when turned on. As an example, the carry clock pulse applied to the carry output switching device Cpu of the nth stage ST_n may be the first carry clock pulse C-CLK__1, as shown in FIG. 4.

The scan output switching device Spu of the nth stage ST_n is controlled by the voltage applied to the set node Q and is connected between a scan clock transfer line which transfers any one of the scan clock pulses S-CLK_# of j phases and the scan output terminal SOT of the nth stage ST_n. That is, the scan output switching device Spu is turned on or off in response to the voltage applied to the set node Q, and interconnects the scan clock transfer line and the scan output terminal SOT when turned on. As an example, the scan clock pulse applied to the scan output switching device Spu of the nth stage ST_n may be the second scan clock pulse S-CLK__2, as shown in FIG. 4.

The stabilization switching device S-Tr of the nth stage ST_n is controlled by a carry clock pulse overlapping with the scan clock pulse applied to the scan output switching device Spu and is connected between a carry output terminal of an (n−p)th stage (where p is a natural number less than n) which outputs an (n−p)th carry pulse and the set node Q. That is, the stabilization switching device S-Tr is turned on or off in response to the carry clock pulse overlapping with the scan clock pulse applied to the scan output switching device Spu, and interconnects the carry output terminal of the (n−p)th stage and the set node Q when turned on. As an example, as shown in FIG. 4, the (n−p)th carry pulse applied to the stabilization switching device S-Tr of the nth stage ST_n may be an (n−1)th carry pulse CRP_n−1, and the carry clock pulse applied to the stabilization switching device S-Tr of the nth stage ST_n may be the second carry clock pulse C-CLK__2.

On the other hand, the stabilization switching device S-Tr of the first stage is supplied with the start pulse Vst from a timing controller instead of the carry pulse.

In this manner, according to the present invention, in the carry output switching device Cpu, scan output switching device Spu and stabilization switching device S-Tr of the same stage, firstly, the carry clock pulse C-CLK__1 applied to the carry output switching device Cpu and the scan clock pulse S-CLK__2 applied to the scan output switching device Spu do not overlap with each other;

secondly, the scan clock pulse S-CLK__2 applied to the scan output switching device Spu is ahead in time of the carry clock pulse C-CLK__1 applied to the carry output switching device Cpu;

thirdly, the carry clock pulse C-CLK__2 applied to the stabilization switching device S-Tr is ahead in time of the carry clock pulse C-CLK__1 applied to the carry output switching device Cpu; and fourthly, the carry clock pulse C-CLK__2 applied to the gate electrode of the stabilization switching device S-Tr is a source signal for generation of the carry pulse CRP_n−1 applied to the source electrode (or drain electrode) of the stabilization switching device S-Tr.

Therefore, the set node Q of the nth stage ST_n is charged by a carry pulse (a carry pulse of a high state) from an upstream stage (for example, ST_n−1) in a set period of the nth stage ST_n and is periodically discharged by the carry pulse (the carry pulse of a low state) in a reset period of the nth stage ST_n and the subsequent period. Here, the discharge period corresponds to the period of the carry clock pulse applied to the stabilization switching device S-Tr.

Hereinafter, the operation of the nth stage ST_n with the above-stated configuration will be described in detail with reference to FIGS. 2 and 4.

1) Set Period Ts

In a set period Ts of the nth stage ST_n, the carry pulse CRP_n−1 of the high state is generated from the (n−1)th stage ST_n−1. Hereinafter, the carry pulse CRP_n−1 from the (n−1)th stage ST_n−1 will be referred to as the (n−1)th carry pulse CRP_n−1. The (n−1)th carry pulse CRP_n−1 is applied to the source electrode (or drain electrode) of the stabilization switching device S-Tr of the nth stage ST_n.

Together with the (n−1)th carry pulse CRP_n−1, the second carry clock pulse C-CLK_2, which is a source signal of the (n−1)th carry pulse CRP_n−1, is also applied to the gate electrode of the stabilization switching device S-Tr. Accordingly, the stabilization switching device S-Tr is turned on, and the (n−1)th carry pulse CRP_n−1 is applied to the set node Q through the turned-on stabilization switching device S-Tr. As a result, the set node Q is charged, and the carry output switching device Cpu and scan output switching device Spu, connected to the charged set node Q through the gate electrodes thereof, are turned on.

2) Output Period To

In an output period To of the nth stage ST_n, the (n−1)th carry pulse CRP_n−1 makes a high to low transition, and the stabilization switching device S-Tr, supplied with the (n−1)th carry pulse CRP_n−1, is thus turned off. As a result, the set node Q floats under the condition that the carry pulse CRP_n−1 of the previous high state is applied thereto. Thus, the carry output switching device Cpu and scan output switching device Spu, connected to the set node Q, still remain on.

On the other hand, in this output period To, the second scan clock pulse S-CLK_2 (for example, ②) of the high state and the first carry clock pulse C-CLK_1 (for example, 3) of the high state are sequentially generated. As a result, the second scan clock pulse S-CLK_2 is output as an nth scan pulse SCP_n through the turned-on scan output switching device Spu, and the first carry clock pulse C-CLK_1 is output as an nth carry pulse CRP_n through the turned-on carry output switching device Cpu.

3) Reset Period Trs

In a reset period Trs of the nth stage ST_n, the second carry clock pulse C-CLK_2 (for example, 4) of the high state is again generated. Accordingly, the stabilization switching device S-Tr, supplied with the second carry clock pulse C-CLK_2, is again turned on. Then, the carry pulse CRP_n−1 of the low state is applied to the set node Q through the turned-on stabilization switching device S-Tr, so as to discharge the set node Q. As a result, the carry output switching device Cpu and scan output switching device Spu, connected to the discharged set node Q through the gate electrodes thereof, are both turned off.

Whenever the second carry clock pulse C-CLK_2 makes a low to high transition from the end of the reset period Trs of the nth stage ST_n to the start of the set period of the next frame, the stabilization switching device S-Tr is periodically turned on, so that the set node Q of the nth stage ST_n is periodically discharged. Therefore, the voltage at the set node Q is stabilized.

As described above, according to the present invention, even if the duty ratio of a scan pulse is so small that a low duration TL is generated between the scan pulse and a scan pulse output in an adjacent period and there is no overlap between carry pulses output in adjacent periods, it is possible to prevent the voltage, denoted by VQ_n, at the set node Q of the corresponding stage from falling in the set period Ts. The reason is that the stabilization switching device S-Tr is turned on for a sufficient time including the low duration TL using a carry pulse. Therefore, as can be seen from FIG. 2, the voltage VQ_n at the set node Q of the nth stage ST_n does not fall, but is maintained as it is, during the low duration TL.

Moreover, in the present invention, the carry output switching device Cpu to output the carry pulse and the scan output switching device Spu to output the scan pulse are separately used, thereby making it possible to reduce the size (channel width) of the carry output switching device Cpu, to which a relatively small load is applied.

Figure 5:
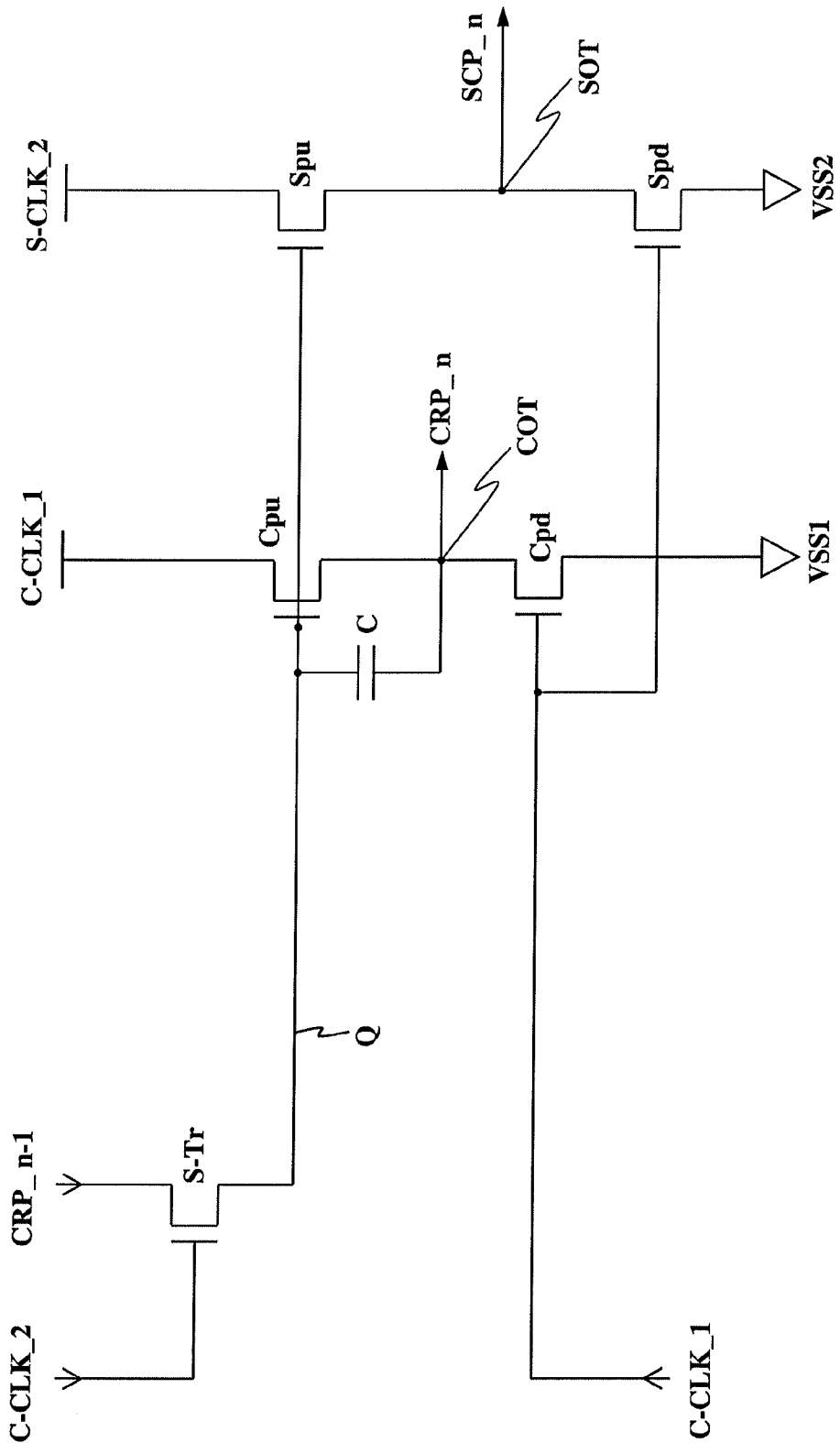
FIG. 5 is a circuit diagram of a second embodiment of the arbitrary stage in FIG. 3.

FIG. 5 is a circuit diagram of a second embodiment of the arbitrary stage in FIG. 3.

The stage according to the second embodiment includes a set node Q, a carry output terminal COT, a scan output terminal SOT, a carry output switching device Cpu, a scan output switching device Spu, a stabilization switching device S-Tr, a carry discharging switching device Cpd, a scan discharging switching device Spd, and an output capacitor C, as shown in FIG. 5.

The carry output switching device Cpu, scan output switching device Spu and stabilization switching device S-Tr in the second embodiment are the same as those in the first embodiment, stated above, respectively, and a description thereof will thus be replaced by the above description of the first embodiment.

The carry discharging switching device Cpd of the nth stage ST_n is controlled by any one carry clock pulse and is connected between the carry output terminal COT of the nth stage ST_n and a first discharging voltage line. That is, the carry discharging switching device Cpd is turned on or off in response to the carry clock pulse, and interconnects the carry output terminal COT and the first discharging voltage line when turned on. As an example, the carry clock pulse applied to the carry discharging switching device Cpd of the nth stage ST_n may be the first carry clock pulse C-CLK_1, as shown in FIG. 5. Here, the first discharging voltage line is supplied with a first discharging voltage VSS1.

The scan discharging switching device Spd of the nth stage ST_n is controlled by any one carry clock pulse and is connected between the scan output terminal SOT of the nth stage ST_n and a second discharging voltage line. That is, the scan discharging switching device Spd is turned on or off in response to the carry clock pulse, and interconnects the scan output terminal SOT and the second discharging voltage line when turned on. Here, the second discharging voltage line is supplied with a second discharging voltage VSS2. As an example, the carry clock pulse applied to the scan discharging switching device Spd of the nth stage ST_n may be the first carry clock pulse C-CLK_1, as shown in FIG. 5.

The output capacitor C of the nth stage ST_n is connected between the set node Q and carry output terminal COT of the nth stage ST_n.

Figure 6:
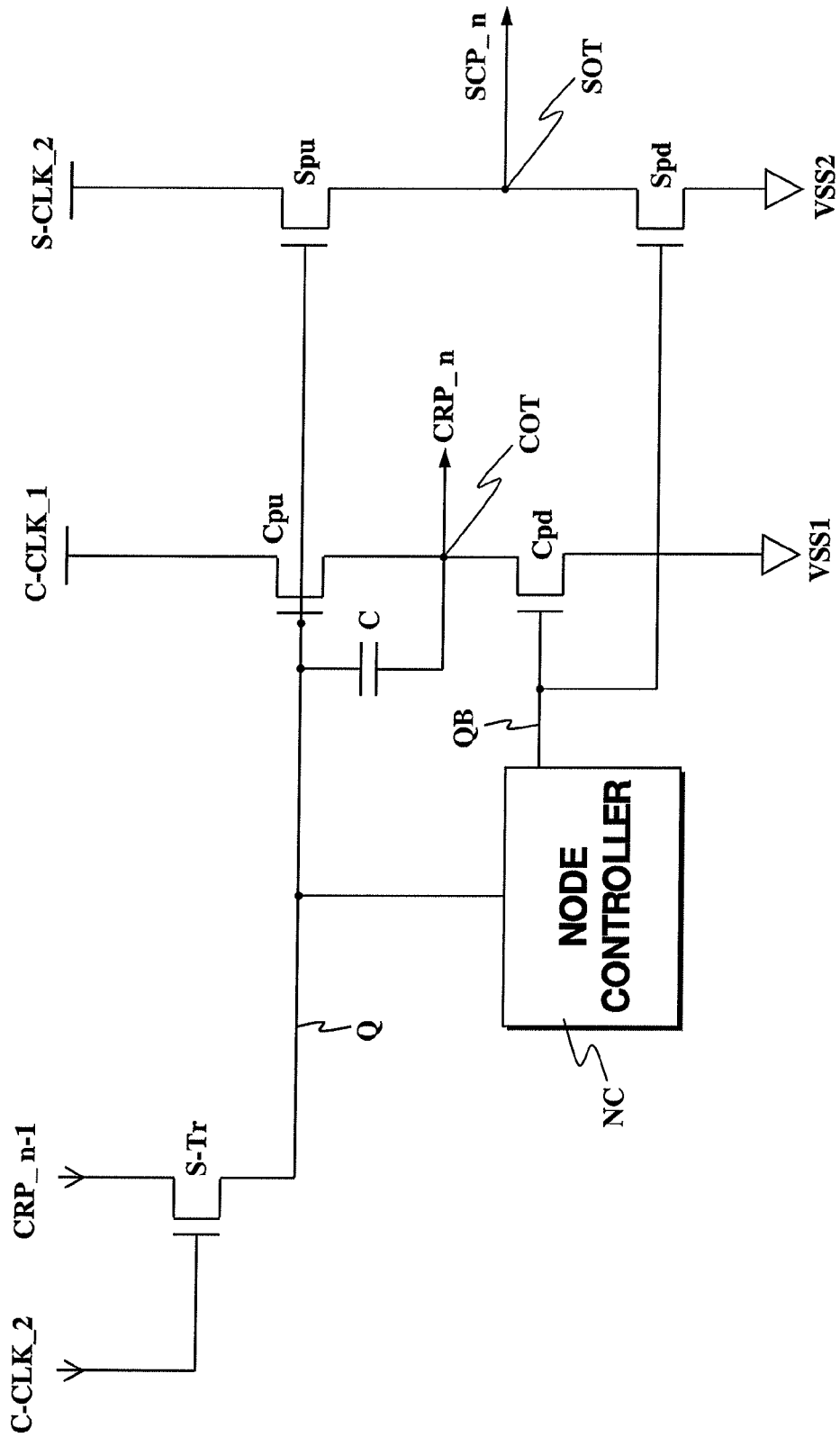
FIG. 6 is a circuit diagram of a third embodiment of the arbitrary stage in FIG. 3.

FIG. 6 is a circuit diagram of a third embodiment of the arbitrary stage in FIG. 3.

The stage according to the third embodiment includes a set node Q, a reset node QB, a carry output terminal COT, a scan output terminal SOT, a carry output switching device Cpu, a scan output switching device Spu, a stabilization switching device S-Tr, a carry discharging switching device Cpd, a scan discharging switching device Spd, a node controller NC, and an output capacitor C, as shown in FIG. 6.

The carry output switching device Cpu, scan output switching device Spu and stabilization switching device S-Tr in the third embodiment are the same as those in the first embodiment, stated above, respectively, and a description thereof will thus be replaced by the above description of the first embodiment.

The output capacitor C in the third embodiment is the same as that in the second embodiment, stated above, and a description thereof will thus be replaced by the above description of the second embodiment.

The node controller NC of the nth stage ST_n controls a voltage at the reset node QB based on the voltage at the set node Q.

The carry discharging switching device Cpd of the nth stage ST_n is controlled by the voltage at the reset node QB and is connected between the carry output terminal COT of the nth stage ST_n and a first discharging voltage line. That is, the carry discharging switching device Cpd is turned on or off in response to the voltage at the reset node QB, and interconnects the carry output terminal COT and the first discharging voltage line when turned on.

The scan discharging switching device Spd of the nth stage ST_n is controlled by the voltage at the reset node QB and is connected between the scan output terminal SOT of the nth stage ST_n and a second discharging voltage line. That is, the scan discharging switching device Spd is turned on or off in response to the voltage at the reset node QB, and interconnects the scan output terminal SOT and the second discharging voltage line when turned on.

Figure 7:
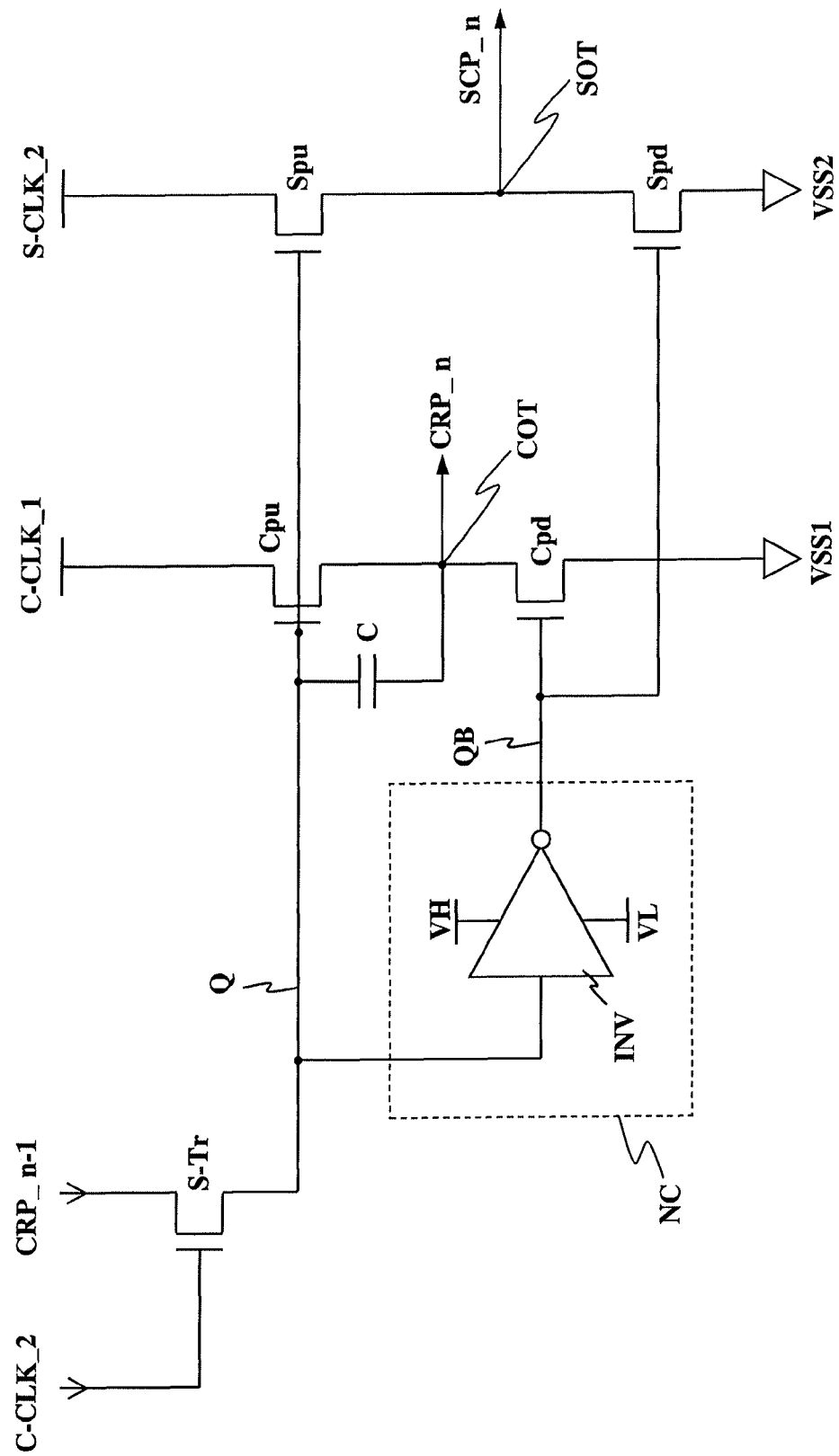
FIG. 7 is a circuit diagram of a fourth embodiment of the arbitrary stage in FIG. 3.

FIG. 7 is a circuit diagram of a fourth embodiment of the arbitrary stage in FIG. 3.

The stage according to the fourth embodiment includes a set node Q, a reset node QB, a carry output terminal COT, a scan output terminal SOT, a carry output switching device Cpu, a scan output switching device Spu, a stabilization switching device S-Tr, a carry discharging switching device Cpd, a scan discharging switching device Spd, a node controller NC, and an output capacitor C, as shown in FIG. 7.

The carry output switching device Cpu, scan output switching device Spu and stabilization switching device S-Tr in the fourth embodiment are the same as those in the first embodiment, stated above, respectively, and a description thereof will thus be replaced by the above description of the first embodiment.

The output capacitor C in the fourth embodiment is the same as that in the second embodiment, stated above, and a description thereof will thus be replaced by the above description of the second embodiment.

The node controller NC in the fourth embodiment is the same as that in the third embodiment, stated above. This node controller NC may include an inverter INV.

The inverter INV controls the voltage at the reset node QB based on the voltage at the set node Q such that the voltage at the set node Q and the voltage at the reset node QB have opposite logics. For example, when the voltage at the set node Q is high, the inverter INV makes the voltage at the reset node QB low. Conversely, when the voltage at the set node Q is low, the inverter INV makes the voltage at the reset node QB high. Here, the inverter INV makes the voltage at the reset node QB high using a high voltage VH, and low using a low voltage VL.

The carry discharging switching device Cpd and scan discharging switching device Spd in the fourth embodiment are the same as those in the third embodiment, stated above, respectively, and a description thereof will thus be replaced by the above description of the third embodiment.

Figure 8:
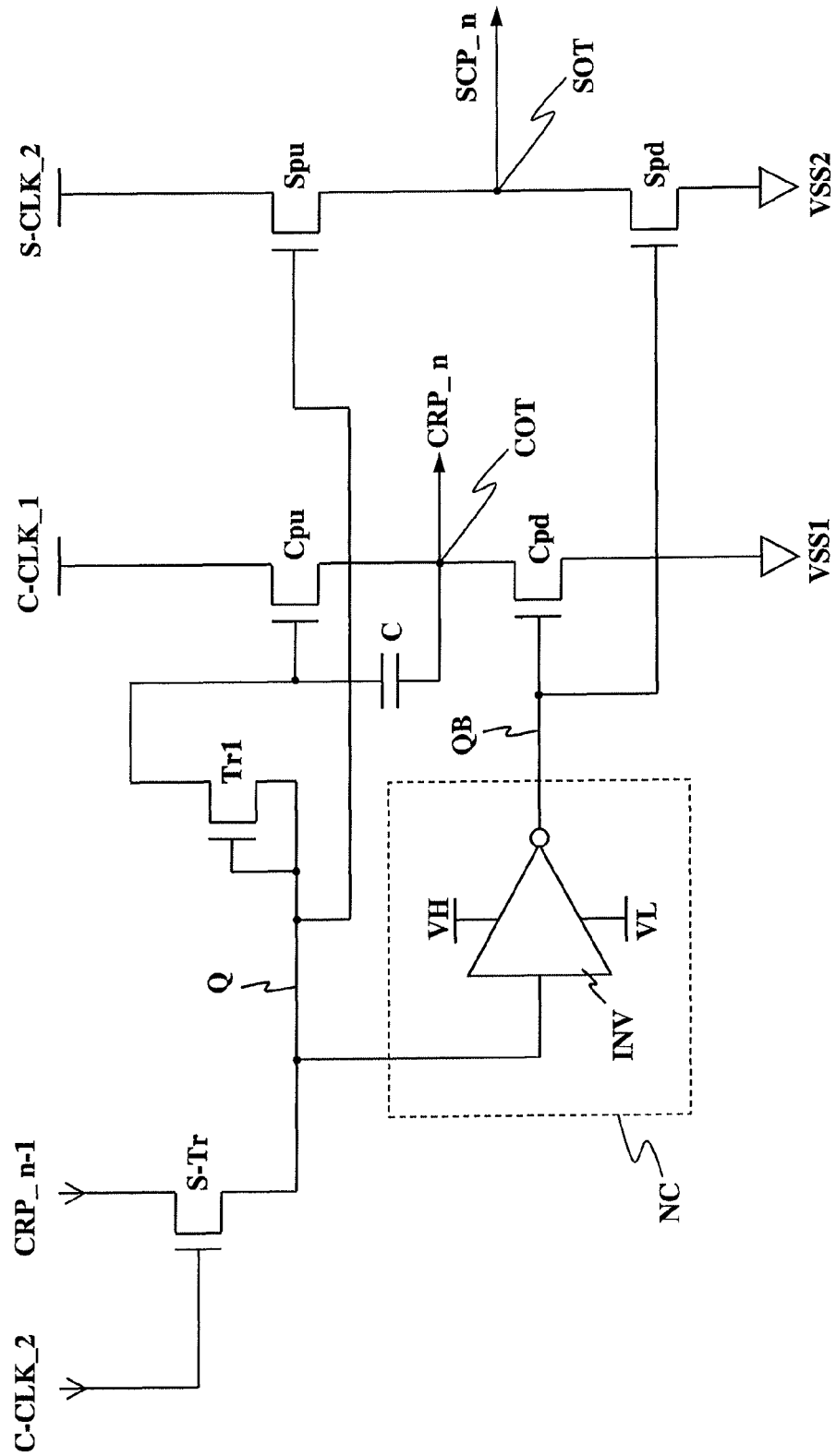
FIG. 8 is a circuit diagram of a fifth embodiment of the arbitrary stage in FIG. 3.

FIG. 8 is a circuit diagram of a fifth embodiment of the arbitrary stage in FIG. 3.

The stage according to the fifth embodiment includes a set node Q, a reset node QB, a carry output terminal COT, a scan output terminal SOT, a carry output switching device Cpu, a scan output switching device Spu, a stabilization switching device S-Tr, a carry discharging switching device Cpd, a scan discharging switching device Spd, a node controller NC, an output capacitor C, and a first switching device Tr1, as shown in FIG. 8.

The carry output switching device Cpu, scan output switching device Spu and stabilization switching device S-Tr in the fifth embodiment are the same as those in the first embodiment, stated above, respectively, and a description thereof will thus be replaced by the above description of the first embodiment.

The output capacitor C in the fifth embodiment is the same as that in the second embodiment, stated above, and a description thereof will thus be replaced by the above description of the second embodiment.

The node controller NC in the fifth embodiment is the same as that in the third embodiment, stated above, and a description thereof will thus be replaced by the above description of the third embodiment.

The inverter INV in the fifth embodiment is the same as that in the fourth embodiment, stated above, and a description thereof will thus be replaced by the above description of the fourth embodiment.

The carry discharging switching device Cpd and scan discharging switching device Spd in the fifth embodiment are the same as those in the third embodiment, stated above, respectively, and a description thereof will thus be replaced by the above description of the third embodiment.

The first switching device Tr1 of the nth stage ST_n is controlled by the voltage at the set node Q and is connected between the set node Q and the gate electrode of the carry output switching device Cpu. That is, the first switching device Tr1 is turned on or off in response to the voltage at the set node Q, and interconnects the set node Q and the gate electrode of the carry output switching device Cpu when turned on.

By virtue of the first switching device Tr1, the carry output switching device Cpu is supplied with the voltage at the set node Q through the first switching device Tr1.

Figure 9:
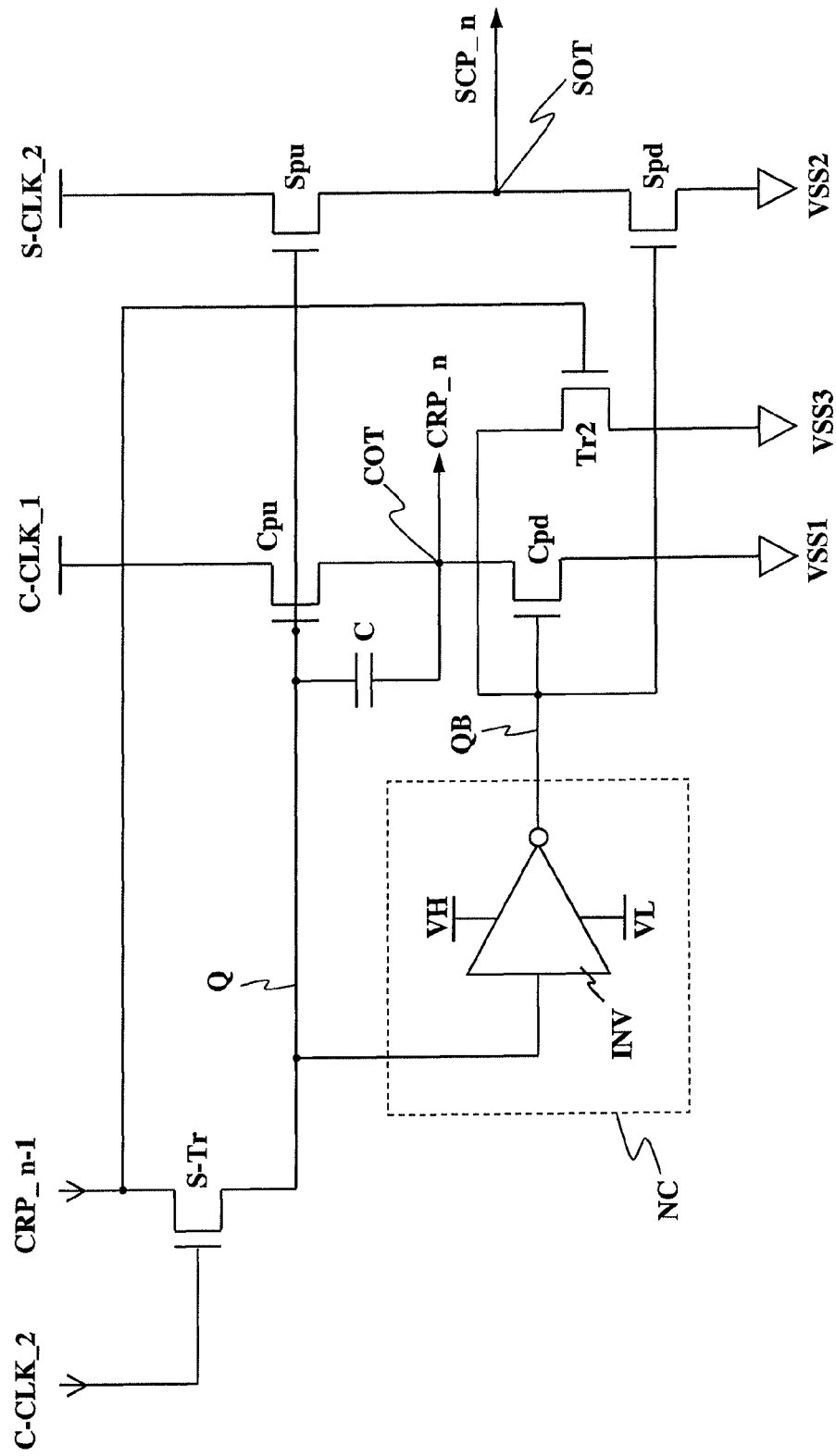
FIG. 9 is a circuit diagram of a sixth embodiment of the arbitrary stage in FIG. 3.

FIG. 9 is a circuit diagram of a sixth embodiment of the arbitrary stage in FIG. 3.

The stage according to the sixth embodiment includes a set node Q, a reset node QB, a carry output terminal COT, a scan output terminal SOT, a carry output switching device Cpu, a scan output switching device Spu, a stabilization switching device S-Tr, a carry discharging switching device Cpd, a scan discharging switching device Spd, a node controller NC, an output capacitor C, and a second switching device Tr2, as shown in FIG. 9.

The carry output switching device Cpu, scan output switching device Spu and stabilization switching device S-Tr in the sixth embodiment are the same as those in the first embodiment, stated above, respectively, and a description thereof will thus be replaced by the above description of the first embodiment.

The output capacitor C in the sixth embodiment is the same as that in the second embodiment, stated above, and a description thereof will thus be replaced by the above description of the second embodiment.

The node controller NC in the sixth embodiment is the same as that in the third embodiment, stated above, and a description thereof will thus be replaced by the above description of the third embodiment.

The inverter INV in the sixth embodiment is the same as that in the fourth embodiment, stated above, and a description thereof will thus be replaced by the above description of the fourth embodiment.

The carry discharging switching device Cpd and scan discharging switching device Spd in the sixth embodiment are the same as those in the third embodiment, stated above, respectively, and a description thereof will thus be replaced by the above description of the third embodiment.

The second switching device Tr2 of the nth stage ST_n is controlled by the carry pulse from the (n−p)th stage and is connected between the reset node QB of the nth stage ST_n and a third discharging voltage line. That is, the second switching device Tr2 is turned on or off in response to the carry pulse from the (n−p)th stage (for example, the (n−1)th stage), and interconnects the reset node QB and the third discharging voltage line when turned on. Here, the third discharging voltage line is supplied with a third discharging voltage VSS3.

Figure 10:
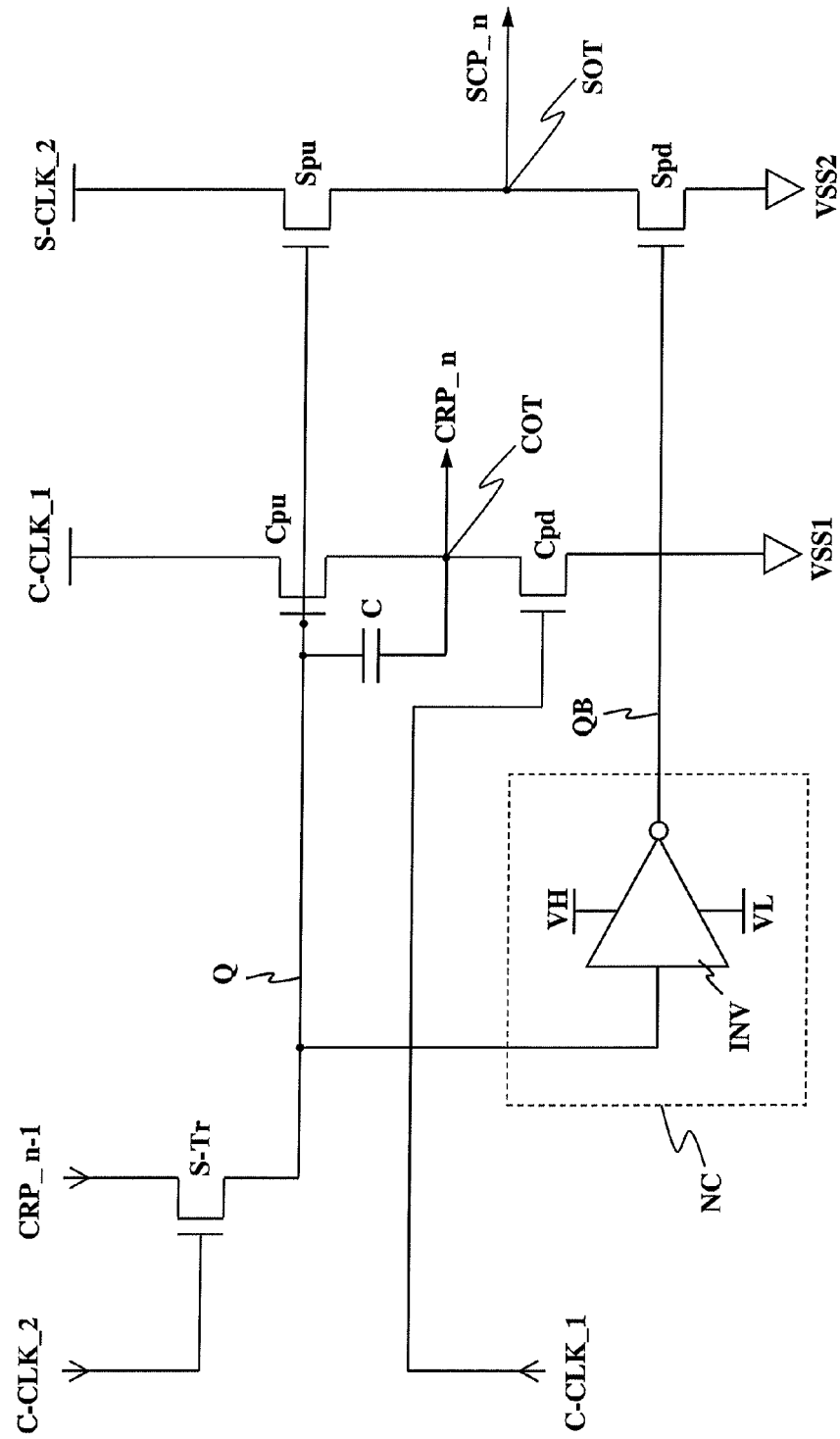
FIG. 10 is a circuit diagram of a seventh embodiment of the arbitrary stage in FIG. 3.

FIG. 10 is a circuit diagram of a seventh embodiment of the arbitrary stage in FIG. 3.

The stage according to the seventh embodiment includes a set node Q, a reset node QB, a carry output terminal COT, a scan output terminal SOT, a carry output switching device Cpu, a scan output switching device Spu, a stabilization switching device S-Tr, a carry discharging switching device Cpd, a scan discharging switching device Spd, a node controller NC, and an output capacitor C, as shown in FIG. 10.

The carry output switching device Cpu, scan output switching device Spu and stabilization switching device S-Tr in the seventh embodiment are the same as those in the first embodiment, stated above, respectively, and a description thereof will thus be replaced by the above description of the first embodiment.

The output capacitor C in the seventh embodiment is the same as that in the second embodiment, stated above, and a description thereof will thus be replaced by the above description of the second embodiment.

The node controller NC in the seventh embodiment is the same as that in the third embodiment, stated above, and a description thereof will thus be replaced by the above description of the third embodiment.

The inverter INV in the seventh embodiment is the same as that in the fourth embodiment, stated above, and a description thereof will thus be replaced by the above description of the fourth embodiment.

The carry discharging switching device Cpd in the seventh embodiment is the same as that in the second embodiment, stated above, and a description thereof will thus be replaced by the above description of the second embodiment.

The scan discharging switching device Spd in the seventh embodiment is the same as that in the third embodiment, stated above, and a description thereof will thus be replaced by the above description of the third embodiment.

On the other hand, in FIG. 10, the gate electrode of the carry discharging switching device Cpd may be connected to the reset node QB instead of a carry clock transfer line, and the gate electrode of the scan discharging switching device Spd may be connected to the carry clock transfer line instead of the reset node QB.

Figure 11:
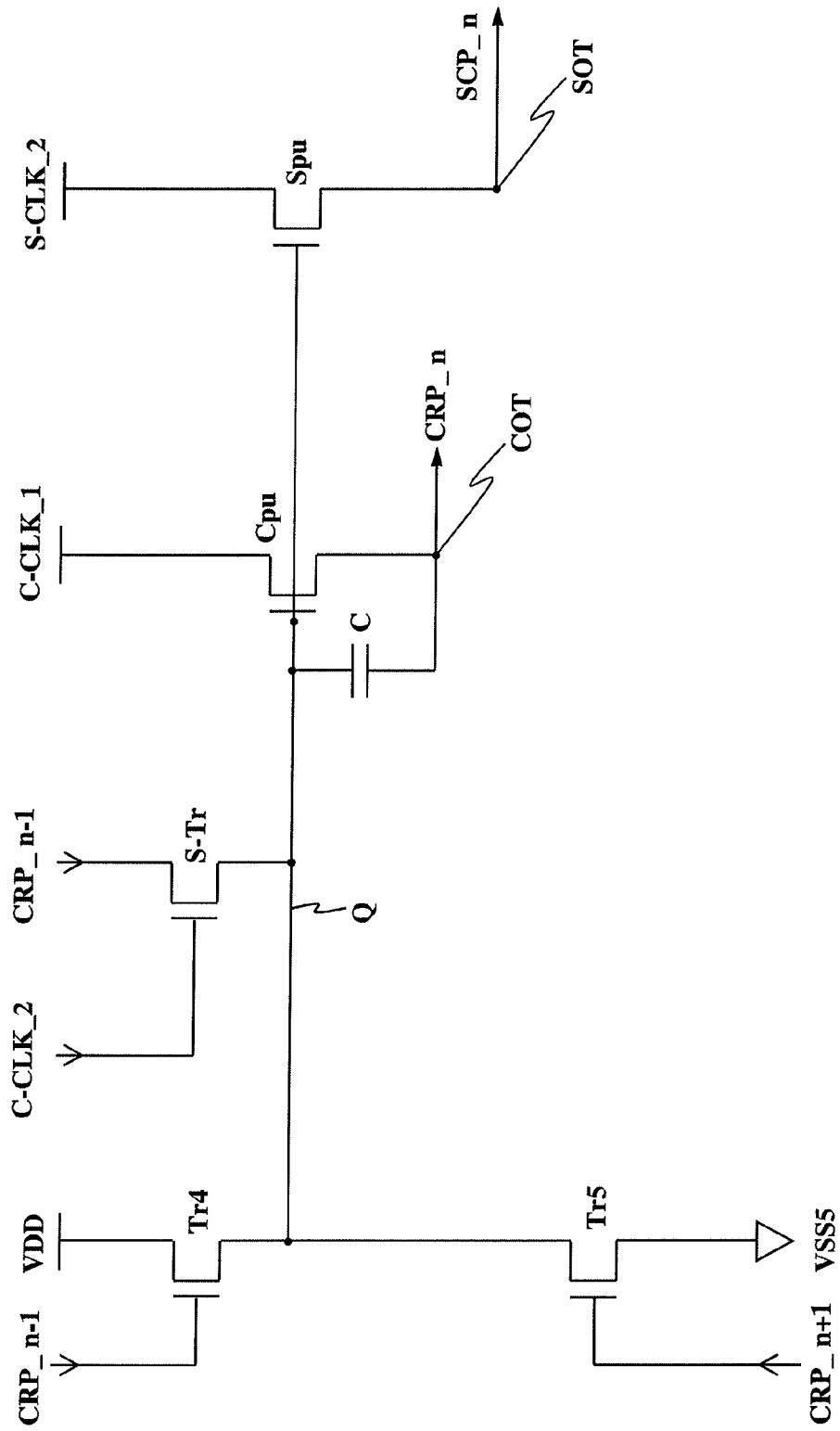
FIG. 11 is a circuit diagram of an eighth embodiment of the arbitrary stage in FIG. 3.

FIG. 11 is a circuit diagram of an eighth embodiment of the arbitrary stage in FIG. 3.

The stage according to the eighth embodiment includes a set node Q, a carry output terminal COT, a scan output terminal SOT, a carry output switching device Cpu, a scan output switching device Spu, a stabilization switching device S-Tr, an output capacitor C, a fourth switching device Tr4, and a fifth switching device Tr5, as shown in FIG. 11.

The carry output switching device Cpu, scan output switching device Spu and stabilization switching device S-Tr in the eighth embodiment are the same as those in the first embodiment, stated above, respectively, and a description thereof will thus be replaced by the above description of the first embodiment.

The output capacitor C in the eighth embodiment is the same as that in the second embodiment, stated above, and a description thereof will thus be replaced by the above description of the second embodiment. The capacitor C may be connected between the set node Q and the scan output terminal SOT instead the carry output terminal COT.

The fourth switching device Tr4 of the nth stage ST_n is controlled by the carry pulse from the (n−p)th stage and is connected between a charging voltage line and the set node Q. That is, the fourth switching device Tr4 is turned on or off in response to the (n−p)th carry pulse, and interconnects the charging voltage line and the set node Q when turned on. Here, the charging voltage line is supplied with a charging voltage VDD. As an example, the (n−p)th carry pulse may be the (n−1)th carry pulse CRP_n−1, as shown in FIG. 11.

The fifth switching device Tr5 of the nth stage ST_n is controlled by a carry pulse from an (n+q)th stage and is connected between a fifth discharging voltage line and the set node Q. That is, the fifth switching device Tr5 is turned on or off in response to the (n+q)th carry pulse, and interconnects the fifth discharging voltage line and the set node Q when turned on. Here, the fifth discharging voltage line is supplied with a fifth discharging voltage VSS5. As an example, the (n+q)th carry pulse may be an (n+1)th carry pulse CRP_n+1, as shown in FIG. 11.

Figure 12:
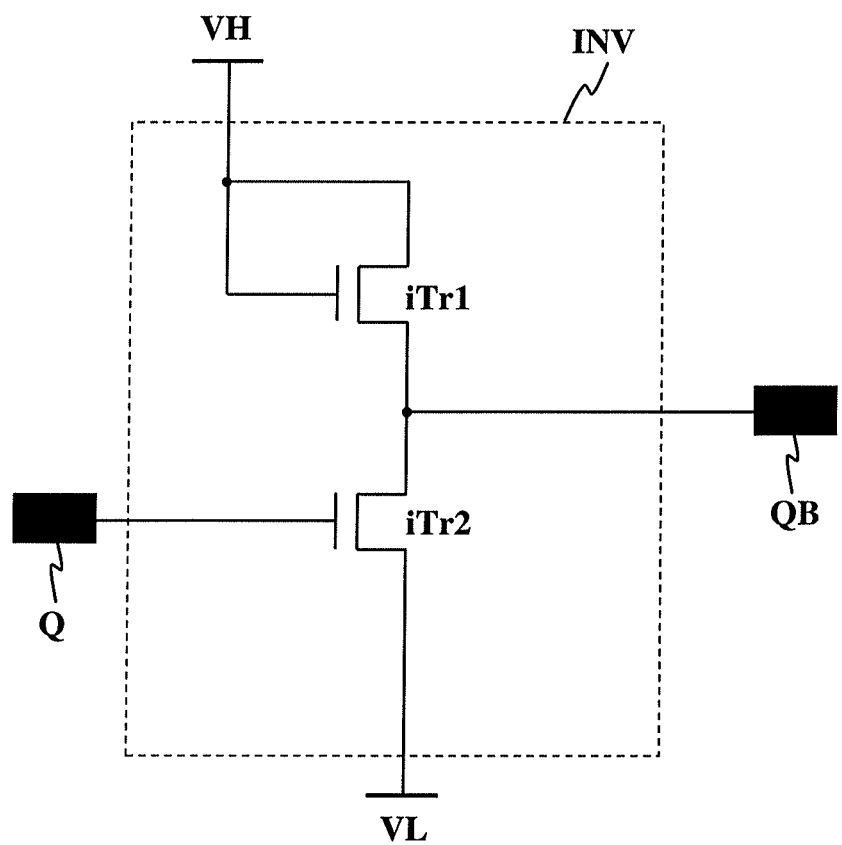
FIG. 12 is a detailed circuit diagram of a first embodiment of an inverter.

FIG. 12 is a detailed circuit diagram of a first embodiment of the inverter INV.

The inverter INV of the nth stage ST_n includes a first inverting switching device iTr1 and a second inverting switching device iTr2, as shown in FIG. 12.

The first inverting switching device iTr1 of the nth stage ST_n is controlled by the high voltage VH from a high voltage line and is connected between the high voltage line and the reset node QB. That is, the first inverting switching device iTr1 is turned on or off in response to the high voltage VH, and interconnects the high voltage line and the reset node QB when turned on.

The second inverting switching device iTr2 of the nth stage ST_n is controlled by the voltage at the set node Q and is connected between the reset node QB and a low voltage line. That is, the second inverting switching device iTr2 is turned on or off in response to the voltage at the set node Q, and interconnects the reset node QB and the low voltage line when turned on. The low voltage line is supplied with the low voltage VL.

Here, the second inverting switching device iTr2 is larger in size (for example, channel width) than the first inverting switching device iTr1 such that the reset node QB is kept discharged when the first inverting switching device iTr1 and the second inverting switching device iTr2 are both kept on.

Figure 13:
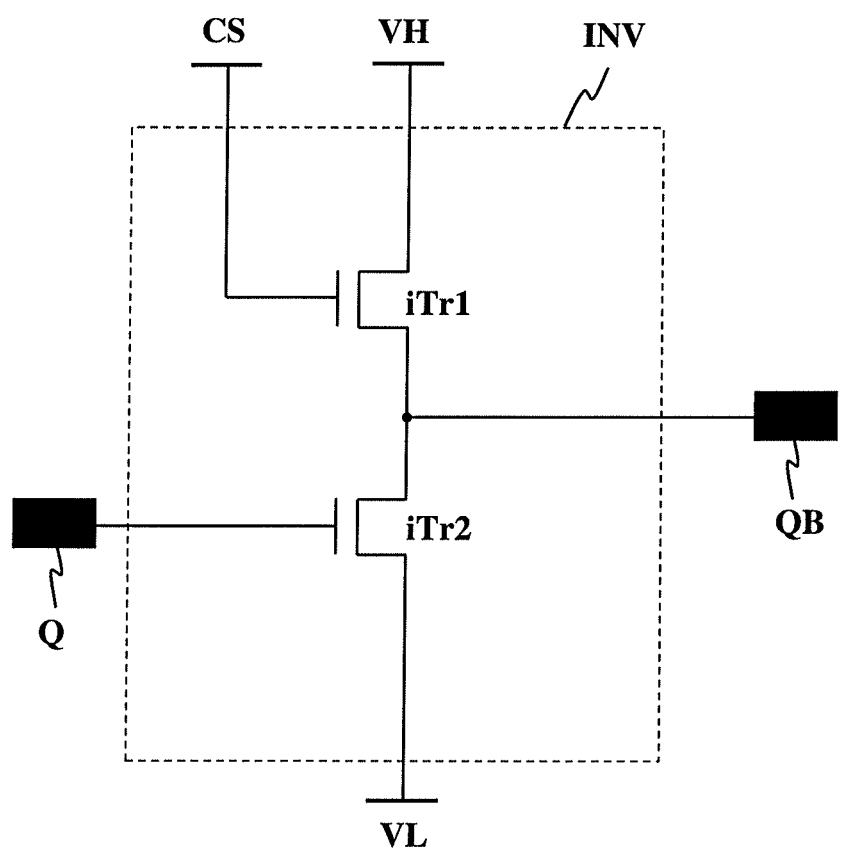
FIG. 13 is a detailed circuit diagram of a second embodiment of the inverter.

FIG. 13 is a detailed circuit diagram of a second embodiment of the inverter INV.

The inverter INV of the nth stage ST_n includes a first inverting switching device iTr1 and a second inverting switching device iTr2, as shown in FIG. 13.

The first inverting switching device iTr1 of the nth stage ST_n is controlled by an external control signal CS and is connected between a high voltage line and the reset node QB. That is, the first inverting switching device iTr1 is turned on or off in response to the control signal CS, and interconnects the high voltage line and the reset node QB when turned on. The high voltage line is supplied with the high voltage VH.

The second inverting switching device iTr2 of the nth stage ST_n is controlled by the voltage at the set node Q and is connected between the reset node QB and a low voltage line. That is, the second inverting switching device iTr2 is turned on or off in response to the voltage at the set node Q, and interconnects the reset node QB and the low voltage line when turned on. The low voltage line is supplied with the low voltage VL.

Here, the control signal CS is kept at a low voltage when the set node Q is kept charged (i.e., high), and at a high voltage when the set node Q is kept discharged (i.e., low). When the control signal CS has the high voltage, the first inverting switching device iTr1, supplied with the control signal CS, is turned on. In contrast, when the control signal CS has the low voltage, the first inverting switching device iTr1, supplied with the control signal CS, is turned off.

Also, the second inverting switching device iTr2 is larger in size (for example, channel width) than the first inverting switching device iTr1 such that the reset node QB is kept discharged when the first inverting switching device iTr1 and the second inverting switching device iTr2 are both kept on.

Figure 14:
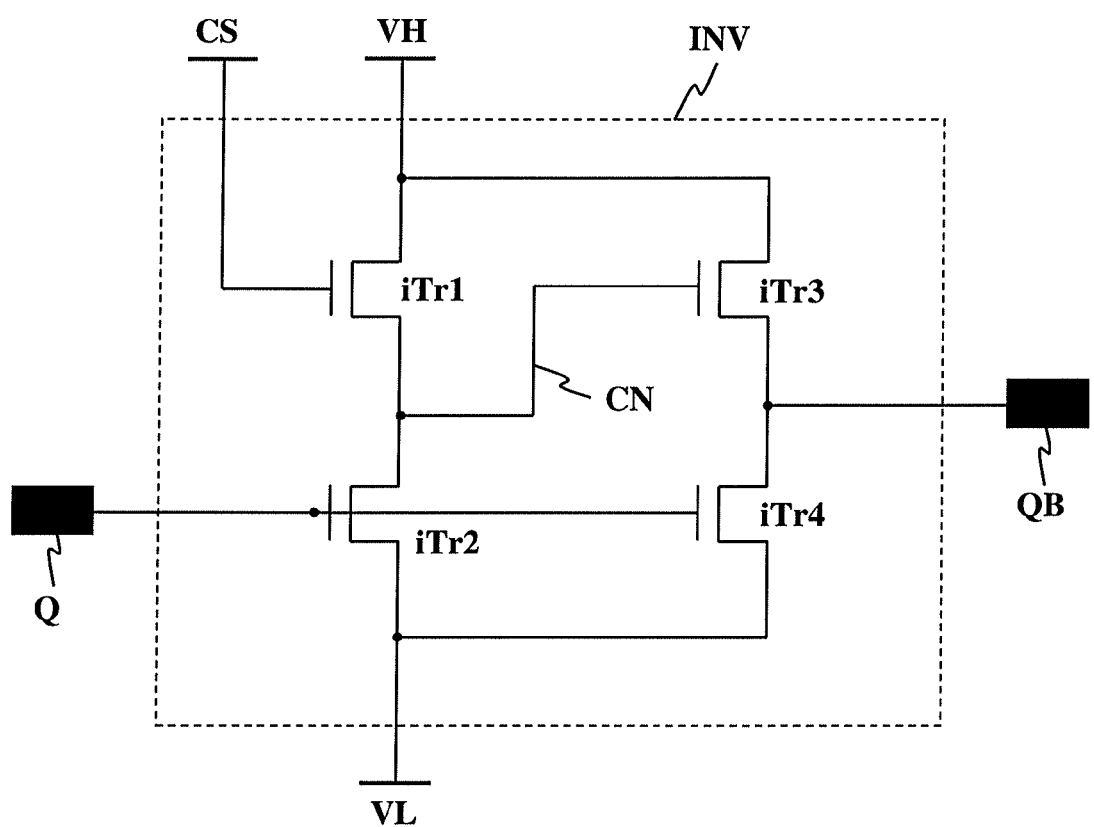
FIG. 14 is a detailed circuit diagram of a third embodiment of the inverter.

FIG. 14 is a detailed circuit diagram of a third embodiment of the inverter INV.

The inverter INV of the nth stage ST_n includes a first inverting switching device iTr1 to a fourth inverting switching device iTr4, as shown in FIG. 14.

The first inverting switching device iTr1 of the nth stage ST_n is controlled by an external control signal CS and is connected between a high voltage line and a common node CN. That is, the first inverting switching device iTr1 is turned on or off in response to the control signal CS, and interconnects the high voltage line and the common node CN when turned on. The high voltage line is supplied with the high voltage VH.

The second inverting switching device iTr2 of the nth stage ST_n is controlled by the voltage at the set node Q and is connected between the common node CN and a low voltage line. That is, the second inverting switching device iTr2 is turned on or off in response to the voltage at the set node Q, and interconnects the common node CN and the low voltage line when turned on. The low voltage line is supplied with the low voltage VL.

The third inverting switching device iTr3 of the nth stage ST_n is controlled by a voltage at the common node CN and is connected between the high voltage line and the reset node QB. That is, the third inverting switching device iTr3 is turned on or off in response to the voltage at the common node CN, and interconnects the high voltage line and the reset node QB when turned on.

The fourth inverting switching device iTr4 of the nth stage ST_n is controlled by the voltage at the set node Q and is connected between the reset node QB and the low voltage line. That is, the fourth inverting switching device iTr4 is turned on or off in response to the voltage at the set node Q, and interconnects the reset node QB and the low voltage line when turned on. The low voltage line is supplied with the low voltage VL, as stated above.

Here, the control signal CS is kept at a low voltage when the set node Q is kept charged (i.e., high), and at a high voltage when the set node Q is kept discharged (i.e., low). When the control signal CS has the high voltage, the first inverting switching device iTr1, supplied with the control signal CS, is turned on. In contrast, when the control signal CS has the low voltage, the first inverting switching device iTr1, supplied with the control signal CS, is turned off.

Also, the second inverting switching device iTr2 is larger in size (for example, channel width) than the first inverting switching device iTr1 such that the reset node QB is kept discharged when the first inverting switching device iTr1 and the second inverting switching device iTr2 are both kept on.

Figure 15:
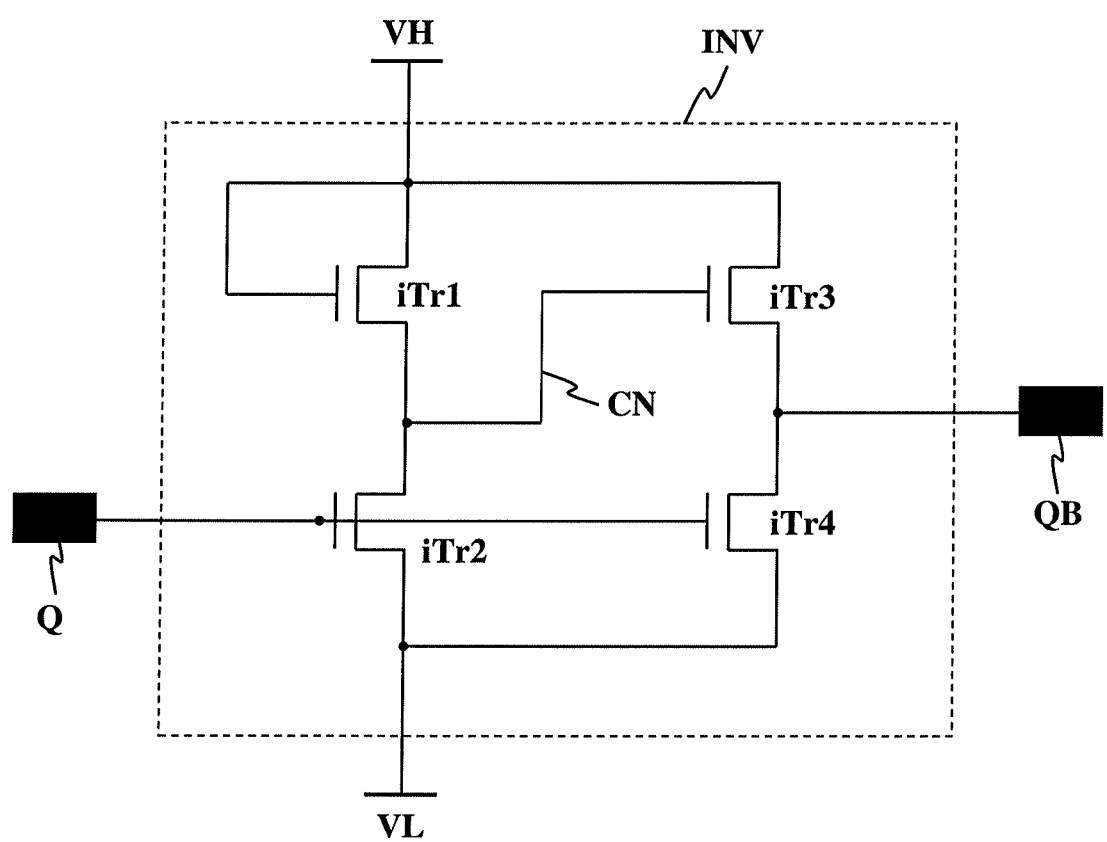
FIG. 15 is a detailed circuit diagram of a fourth embodiment of the inverter.

FIG. 15 is a detailed circuit diagram of a fourth embodiment of the inverter INV.

The inverter INV of the nth stage ST_n includes a first inverting switching device iTr1 to a fourth inverting switching device iTr4, as shown in FIG. 15.

The first inverting switching device iTr1 of the nth stage ST_n is controlled by the high voltage VH from a high voltage line and is connected between the high voltage line and a common node CN. That is, the first inverting switching device iTr1 is turned on or off in response to the high voltage VH, and interconnects the high voltage line and the common node CN when turned on.

The second inverting switching device iTr2 of the nth stage ST_n is controlled by the voltage at the set node Q and is connected between the common node CN and a low voltage line. That is, the second inverting switching device iTr2 is turned on or off in response to the voltage at the set node Q, and interconnects the common node CN and the low voltage line when turned on. The low voltage line is supplied with the low voltage VL.

The third inverting switching device iTr3 of the nth stage ST_n is controlled by a voltage at the common node CN and is connected between the high voltage line and the reset node QB. That is, the third inverting switching device iTr3 is turned on or off in response to the voltage at the common node CN, and interconnects the high voltage line and the reset node QB when turned on.

The fourth inverting switching device iTr4 of the nth stage ST_n is controlled by the voltage at the set node Q and is connected between the reset node QB and the low voltage line. That is, the fourth inverting switching device iTr4 is turned on or off in response to the voltage at the set node Q, and interconnects the reset node QB and the low voltage line when turned on. The low voltage line is supplied with the low voltage VL, as stated above.

Here, the second inverting switching device iTr2 is larger in size (for example, channel width) than the first inverting switching device iTr1 such that the reset node QB is kept discharged when the first inverting switching device iTr1 and the second inverting switching device iTr2 are both kept on.

Figure 16:
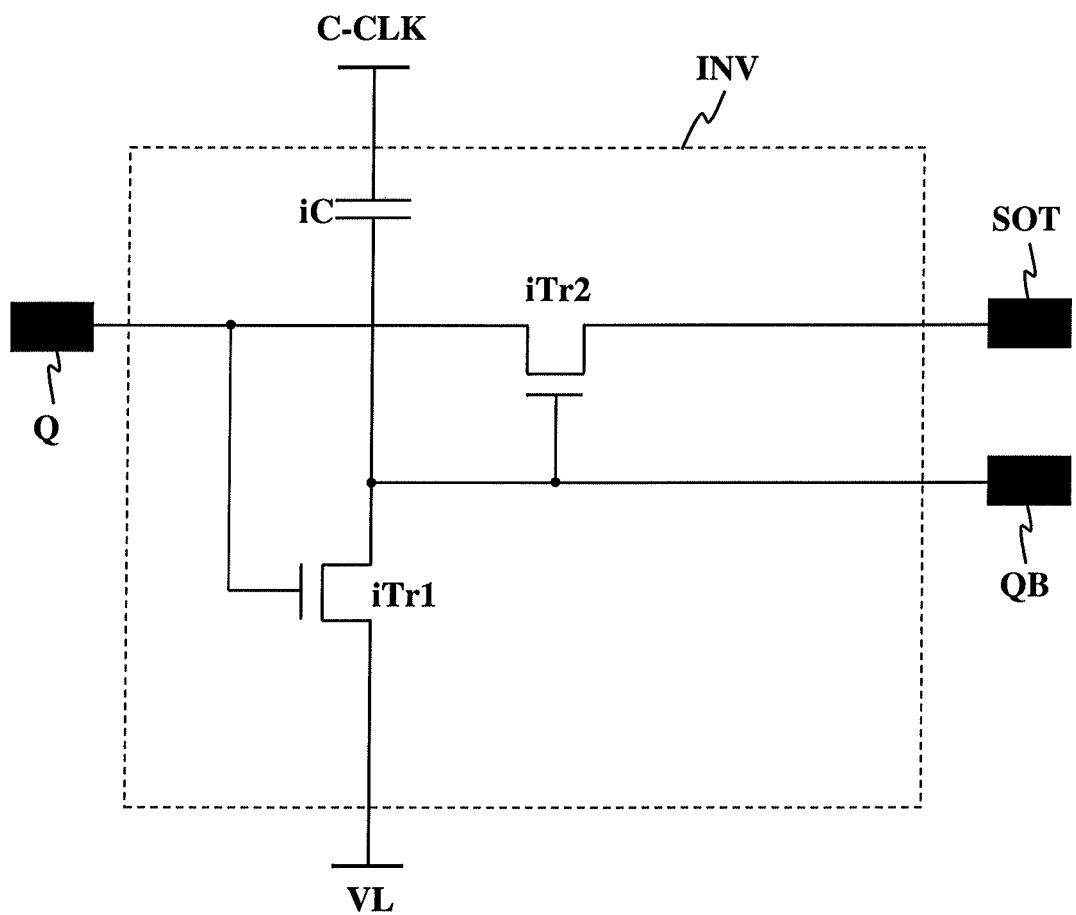
FIG. 16 is a detailed circuit diagram of a fifth embodiment of the inverter.

FIG. 16 is a detailed circuit diagram of a fifth embodiment of the inverter INV.

The inverter INV of the nth stage ST_n includes a first inverting switching device iTr1, a second inverting switching device iTr2, and an inverting capacitor iC, as shown in FIG. 16.

The first inverting switching device iTr1 of the nth stage ST_n is controlled by the voltage at the set node Q and is connected between the reset node QB and a low voltage line. That is, the first inverting switching device iTr1 is turned on or off in response to the voltage at the set node Q, and interconnects the reset node QB and the low voltage line when turned on. The low voltage line is supplied with the low voltage VL.

The second inverting switching device iTr2 of the nth stage ST_n is controlled by the voltage at the reset node QB and is connected between the set node Q and the scan output terminal SOT. That is, the second inverting switching device iTr2 is turned on or off in response to the voltage at the reset node QB, and interconnects the set node Q and the scan output terminal SOT when turned on.

The inverting capacitor iC of the nth stage ST_n is connected between any one carry clock transfer line and the reset node QB. Here, the clock transfer line is supplied with a carry clock pulse C-CLK.

Figure 17:
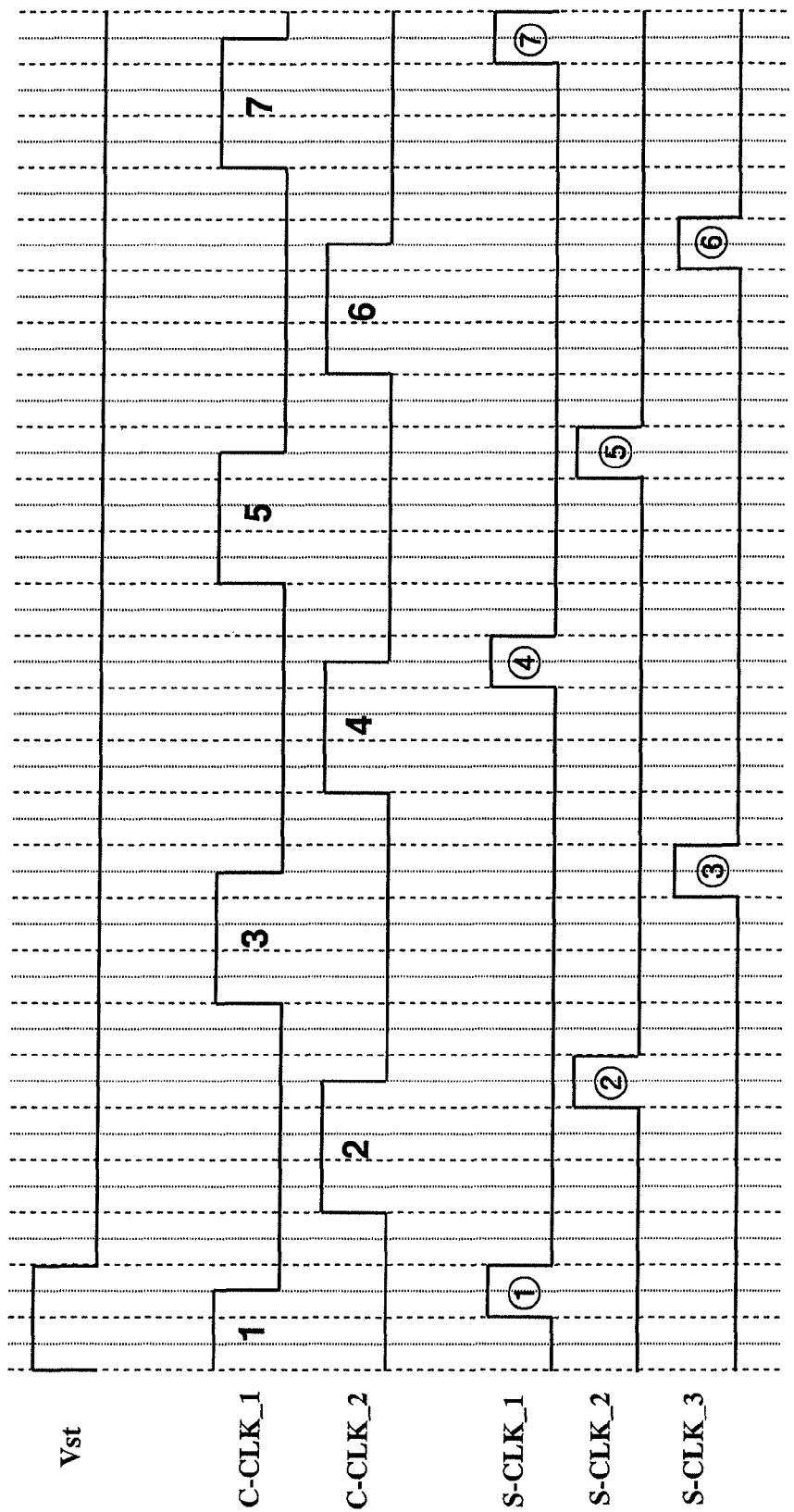
FIG. 17 is an output timing diagram illustrating carry clock pulses and scan clock pulses of another example output from the carry clock generator and scan clock generator in FIG. 1.

FIG. 17 is an output timing diagram illustrating carry clock pulses and scan clock pulses of another example output from the carry clock generator and scan clock generator in FIG. 1.

As shown in FIG. 17, carry clock pulses C-CLK_1 and C-CLK_2 of two phases may be generated from the carry clock generator CCG, and scan clock pulses S-CLK_1, S-CLK_2 and S-CLK_3 of three phases may be generated from the scan clock generator SCG. In this case, the first carry clock pulse C-CLK_1 is ahead in phase of the second carry clock pulse C-CLK_2. The first carry clock pulse C-CLK_1 includes a plurality of carry impulses 1, 3, 5, . . . which are periodically output, and the second carry clock pulse C-CLK_2 likewise includes a plurality of carry impulses 2, 4, 6, . . . which are periodically output.

FIG. 17 shows the scan clock pulses S-CLK_1, S-CLK_2 and S-CLK_3 of the three phases, in which the first scan clock pulse S-CLK_1 is ahead in phase of the second scan clock pulse S-CLK_2 and the second scan clock pulse S-CLK_2 is ahead in phase of the third scan clock pulse S-CLK_3. The first scan clock pulse S-CLK_1 includes a plurality of scan impulses ①, ④, . . . which are periodically output, the second scan clock pulse S-CLK_2 likewise includes a plurality of scan impulses ②, ⑤, . . . which are periodically output, and the third scan clock pulse S-CLK_3 likewise includes a plurality of scan impulses ③, ⑥, . . . which are periodically output.

Here, the scan impulses included in each of the above three scan clock pulses S-CLK_1 to S-CLK_3 overlap with carry impulses included in at least one carry clock pulse, respectively. In detail, each scan impulse in a scan clock pulse output in the kth order (where k is any one of natural numbers from 1 to j), among j scan clock pulses, overlaps with a carry impulse output in the (jm+k)th order (where m is a natural number including 0), among carry impulses in i carry clock pulses. A more detailed description will hereinafter be given with reference to an example.

That is, assuming that i and j are set respectively to 2 and 3 as shown in FIG. 17, the above expression 'jm+k' is defined as '3m+k', where k is any one of natural numbers from 1 to 3. In this case, the scan clock pulse S-CLK_1 output in the first order (i.e., k=1), among the three scan clock pulses S-CLK_1 to S-CLK_3, overlaps with a carry impulse output in the '(3m+1)th' order. In other words, the scan clock pulse S-CLK_1 output in the first order includes the scan impulses ①, ④, . . . , which overlap with the carry impulses 1, 4, . . . sequentially output in the (3m+1)th order, respectively.

In the same manner, the scan clock pulse S-CLK_2 output in the second order (i.e., k=2), among the three scan clock pulses S-CLK_1 to S-CLK_3, overlaps with a carry impulse output in the '(3m+2)th' order. In other words, the scan clock pulse S-CLK_2 output in the second order includes the scan impulses ②, ⑤, . . . , which overlap with the carry impulses 2, 5, . . . sequentially output in the (3m+2)th order, respectively.

In the same manner, the scan clock pulse S-CLK_3 output in the third order (i.e., k=3), among the three scan clock pulses S-CLK_1 to S-CLK_3, overlaps with a carry impulse output in the '(3m+3)th' order. In other words, the scan clock pulse S-CLK_3 output in the third order includes the scan impulses ③, ⑥, . . . , which overlap with the carry impulses 3, 6, . . . sequentially output in the (3m+3)th order, respectively.

Figure 18:
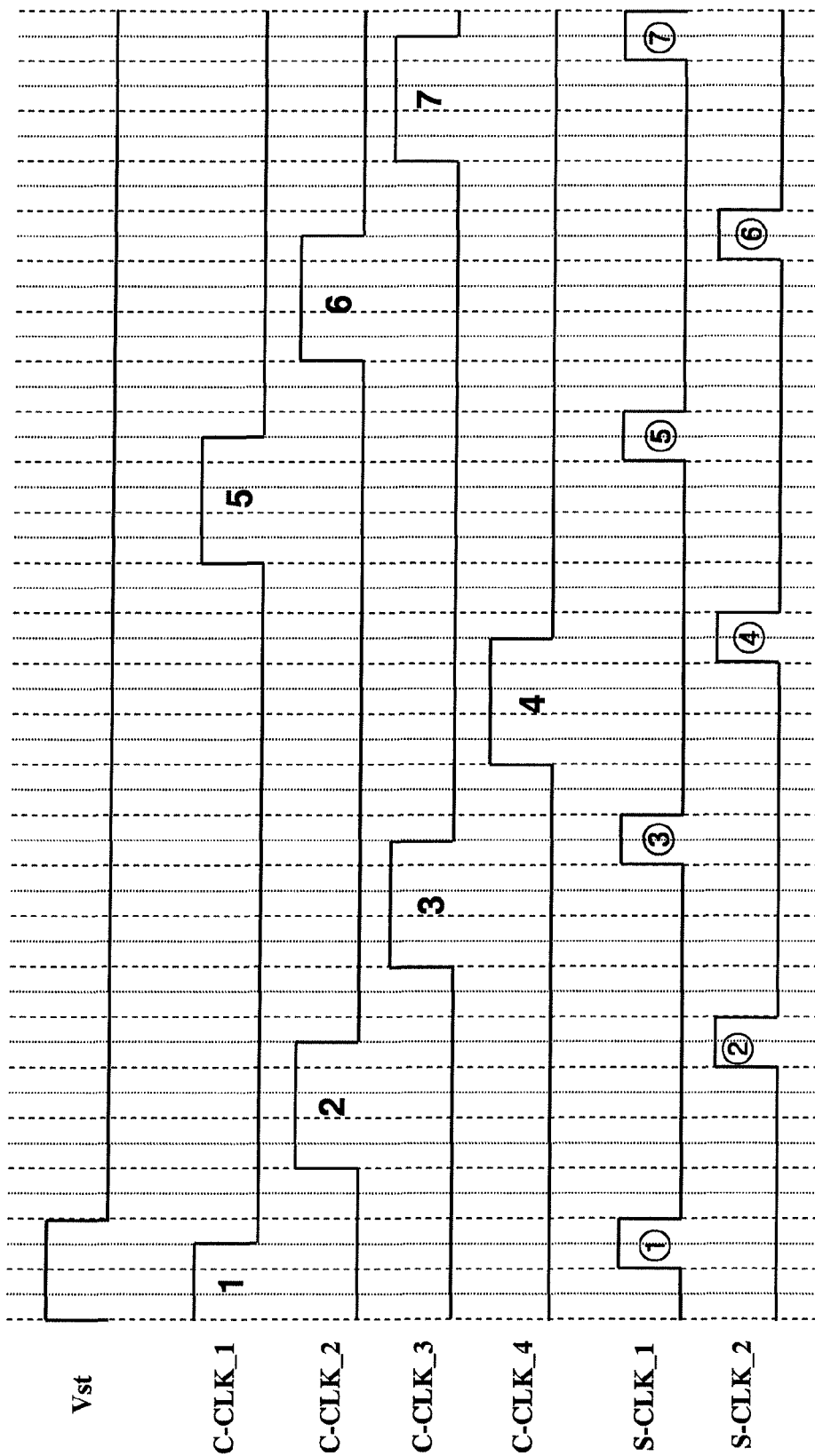
FIG. 18 is an output timing diagram illustrating carry clock pulses and scan clock pulses of another example output from the carry clock generator and scan clock generator in FIG. 1.

FIG. 18 is an output timing diagram illustrating carry clock pulses and scan clock pulses of another example output from the carry clock generator and scan clock generator in FIG. 1.

As shown in FIG. 18, carry clock pulses C-CLK_1, C-CLK_2, C-CLK_3 and C-CLK_4 of four phases may be generated from the carry clock generator CCG, and scan clock pulses S-CLK_1 and S-CLK_2 of two phases may be generated from the scan clock generator SCG. In this case, the first carry clock pulse C-CLK_1 is ahead in phase of the second carry clock pulse C-CLK_2, the second carry clock pulse C-CLK_2 is ahead in phase of the third carry clock pulse C-CLK_3, and the third carry clock pulse C-CLK_3 is ahead in phase of the fourth carry clock pulse C-CLK_4. The first carry clock pulse C-CLK_1 includes a plurality of carry impulses 1, 5, . . . which are periodically output, the second carry clock pulse C-CLK_2 likewise includes a plurality of carry impulses 2, 6, . . . which are periodically output, the third carry clock pulse C-CLK_3 likewise includes a plurality of carry impulses 3, 7, . . . which are periodically output, and the fourth carry clock pulse C-CLK_4 likewise includes a plurality of carry impulses 4, . . . which are periodically output.

FIG. 18 shows the scan clock pulses S-CLK_1 and S-CLK_2 of the two phases, in which the first scan clock pulse S-CLK_1 is ahead in phase of the second scan clock pulse S-CLK_2. The first scan clock pulse S-CLK_1 includes a plurality of scan impulses ①, ③, ⑤, . . . which are periodically output, and the second scan clock pulse S-CLK_2 likewise includes a plurality of scan impulses ②, ④, ⑥, . . . which are periodically output.

Here, the scan impulses included in each of the above two scan clock pulses S-CLK_1 and S-CLK_2 overlap with carry impulses included in at least one carry clock pulse, respectively. In detail, each scan impulse in a scan clock pulse output in the kth order (where k is any one of natural numbers from 1 to j), among j scan clock pulses, overlaps with a carry impulse output in the (jm+k)th order (where m is a natural number including 0), among carry impulses in carry clock pulses. A more detailed description will hereinafter be given with reference to an example.

That is, assuming that i and j are set respectively to 4 and 2 as shown in FIG. 18, the above expression 'jm+k' is defined as '2m+k', where k is any one of natural numbers from 1 to 2. In this case, the scan clock pulse S-CLK_1 output in the first order (i.e., k=1), of the two scan clock pulses S-CLK_1 and S-CLK_2, overlaps with a carry impulse output in the '(2m+1)th' order. In other words, the scan clock pulse S-CLK_1 output in the first order includes the scan impulses ①, ③, ⑤, . . . , which overlap with the carry impulses 1, 3, 5, . . . sequentially output in the (2m+1)th order, respectively.

In the same manner, the scan clock pulse S-CLK_2 output in the second order (i.e., k=2), of the two scan clock pulses S-CLK_1 and S-CLK_2, overlaps with a carry impulse output in the '(2m+2)th' order. In other words, the scan clock pulse S-CLK_2 output in the second order includes the scan impulses ②, ④, ⑥, . . . , which overlap with the carry impulses 2, 4, 6, . . . sequentially output in the (2m+2)th order, respectively.

On the other hand, in all embodiments, the scan output switching device Spu may have a channel width set to be larger than that of the carry output switching device Cpu. The reason is that the scan output switching device Spu is connected to a larger load than the carry output switching device Cpu. That is, the carry output switching device Cpu is connected only to adjacent stages, whereas the scan output switching device Spu is connected to a large load, which is a display panel, through a gate line.

Also, in the embodiments in which the carry output switching device Cpu, the carry discharging switching device Cpd, the scan output switching device Spu and the scan discharging switching device Spd are all provided in one stage, among all the above-stated embodiments, assuming that the channel width of the carry output switching device Cpu is W1, the channel width of the carry discharging switching device Cpd is W2, the channel width of the scan output switching device Spu is W3 and the channel width of the scan discharging switching device Spd is W4, W1 to W4 may be set to such values as to satisfy an equation of (W4/W3)<(W2/W1).

On the other hand, in all embodiments, the upstream stage may be any one of stages positioned upstream of the arbitrary stage. For example, assuming that the arbitrary stage is the nth stage ST_n, the upstream stage may be an (n−x)th stage, where x is a natural number less than n. Also, the downstream stage may be any one of stages positioned downstream of the arbitrary stage. For example, assuming that the arbitrary stage is the nth stage ST_n, the downstream stage may be an (n+y)th stage, where y is a natural number. In this case, x and y may be the same or different.

Also, in all embodiments, each stage may further include another output capacitor connected between the set node Q and the scan output terminal thereof.

Figure 19:
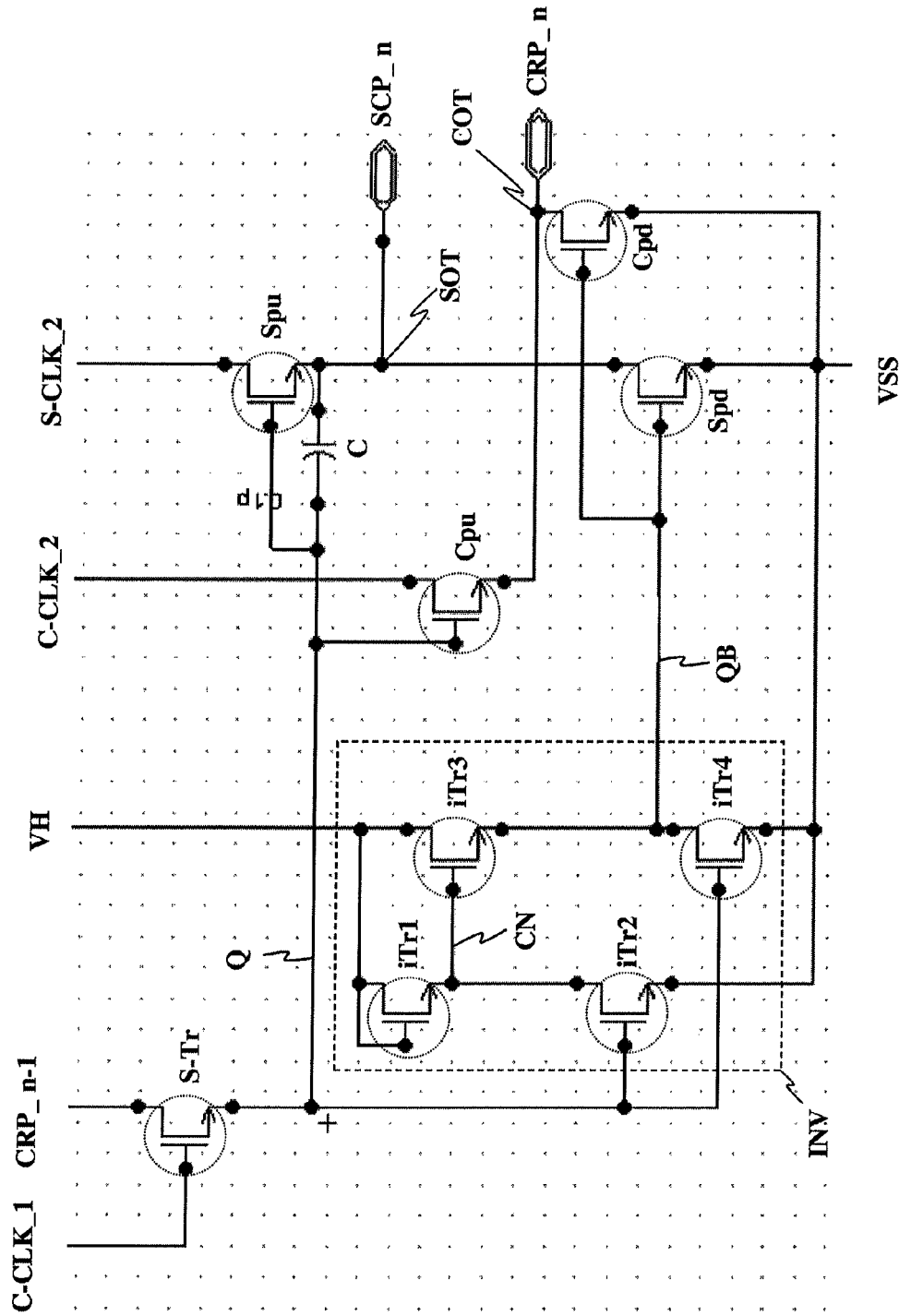
FIG. 19 is a circuit diagram illustrating a reconstructed version of the structure of the arbitrary stage of FIG. 7 based on a simulation program.
Figure 20:
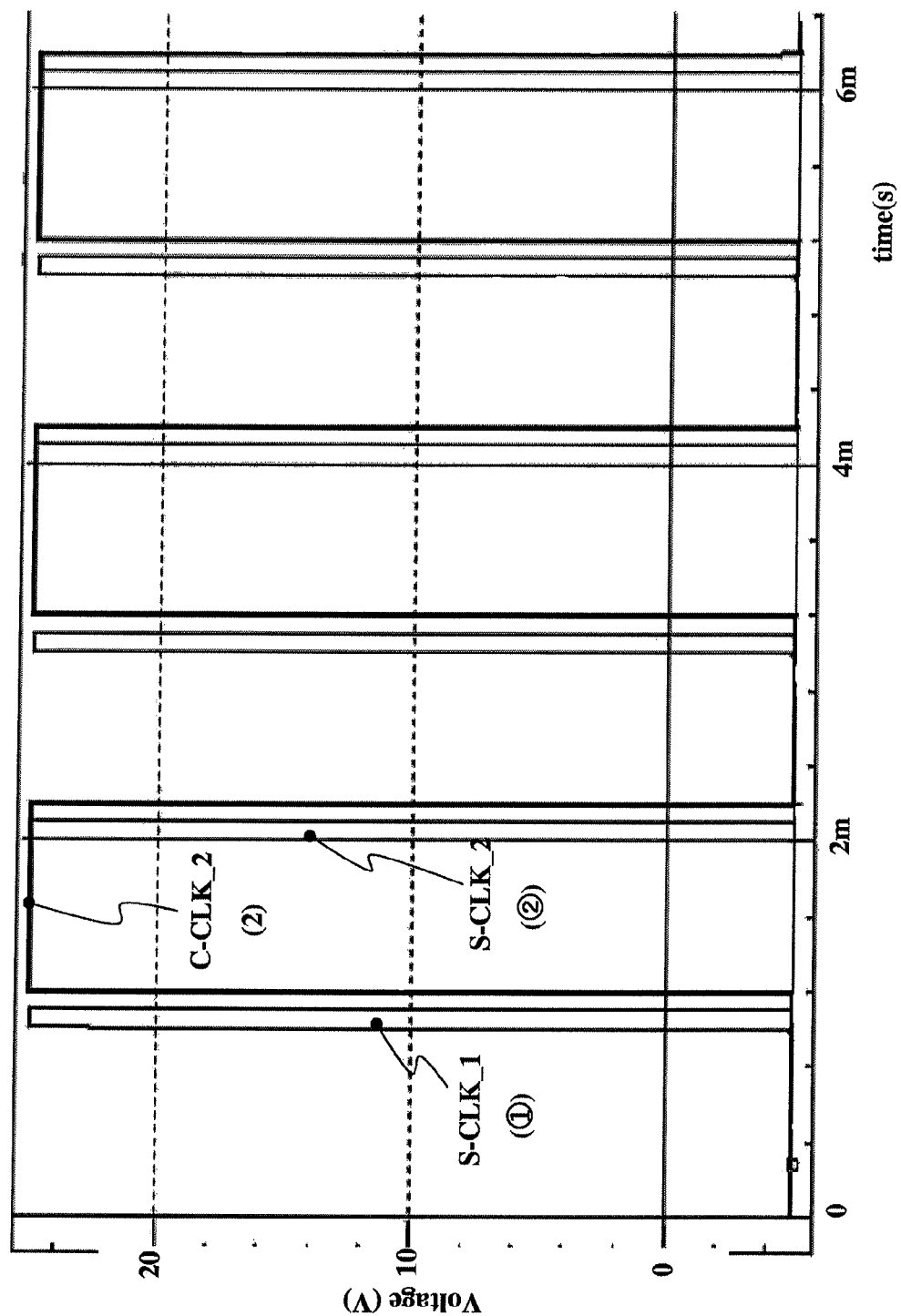
FIG. 20 is a waveform diagram of a second carry clock pulse, a first scan clock pulse and a second scan clock pulse based on a simulation program.
Figure 21:
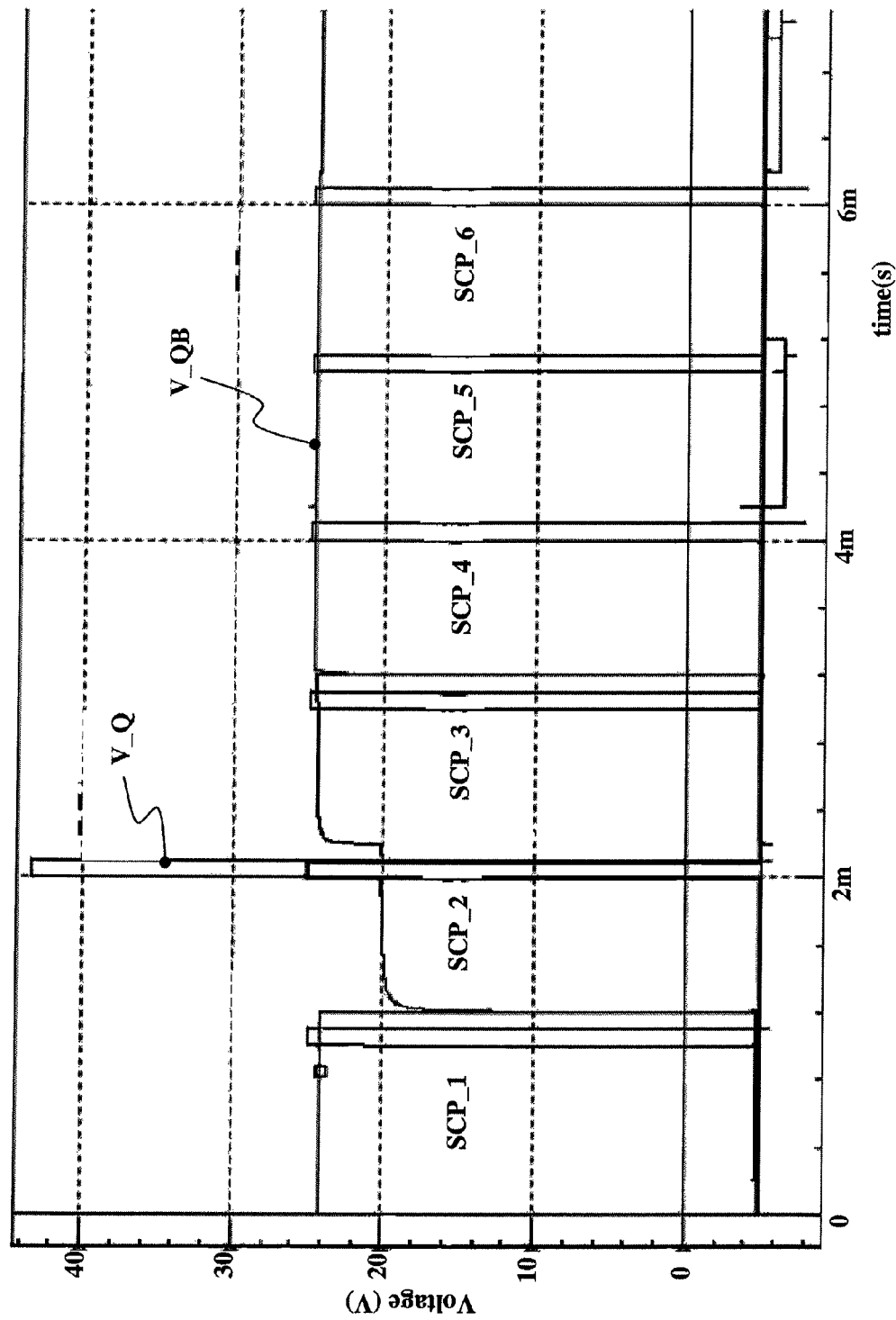
FIG. 21 is a waveform diagram of a scan pulse output from the stage of FIG. 19 when the carry and scan clock pulses of FIG. 20 are applied to the stage of FIG. 19.

FIGS. 19 to 21 illustrate results of verifying the operation of the shift register according to the present invention using simulation programs.

In detail, FIG. 19 is a circuit diagram illustrating a reconstructed version of the structure of the nth stage of FIG. 7 based on a simulation program.

A discharging voltage VSS in FIG. 19 may be any one of the previously-stated first to fifth discharging voltages VSS1 to VSS5. These first to fifth discharging voltages VSS1 to VSS5 are DC voltages having voltage levels capable of turning off the corresponding switching devices, stated previously. The first to fifth discharging voltages VSS1 to VSS5 may all have the same values. Alternatively, some of the first to fifth discharging voltages VSS1 to VSS5 may have the same values and the others may have different values. As another alternative, the first to fifth discharging voltages VSS1 to VSS5 may all have different values.

An inverter in FIG. 19 has the above-stated configuration shown in FIG. 15. Exceptionally, in FIG. 19, the low voltage VL in FIG. 15 is replaced with the above discharging voltage VSS.

FIG. 20 is a waveform diagram of a second carry clock pulse, a first scan clock pulse and a second scan clock pulse based on a simulation program.

The second carry clock pulse in FIG. 20 corresponds to a carry impulse (for example, 2) in the second carry clock pulse in FIG. 2, stated previously, the first scan clock pulse in FIG. 20 corresponds to a scan impulse (for example, ①) in the first scan clock pulse in FIG. 2, stated previously, and the second scan clock pulse in FIG. 20 corresponds to a scan impulse (for example, ②) in the second scan clock pulse in FIG. 2, stated previously. Exceptionally, in FIG. 20, the second scan clock pulse has a rising edge and a falling edge which are both positioned within the pulse width of the second carry clock pulse.

FIG. 21 is a waveform diagram of a scan pulse output from the stage of FIG. 19 when the carry and scan clock pulses of FIG. 20 are applied to the stage of FIG. 19.

In FIG. 21, a second scan pulse signifies the scan pulse output from the stage of FIG. 19 and the other scan pulses signify scan pulses output from other stages adjacent to the stage of FIG. 19. Therefore, it can be seen that scan pulses from respective stages are stably output.

On the other hand, in FIG. 21, V_Q signifies a voltage at a set node of the stage of FIG. 19 and V_QB signifies a voltage at a reset node of the stage of FIG. 19.

As is apparent from the above description, the present invention has effects as follows.

According to the present invention, even if the duty ratio of a scan pulse is so small that a low duration is generated between the scan pulse and a scan pulse output in an adjacent period or between carry pulses output in adjacent periods, it is possible to prevent a voltage at a set node of a corresponding stage from falling in a set period of the stage. Therefore, the scan pulse can be stably generated in an output period of the stage.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages, each of the stages outputting a carry pulse and a scan pulse,
wherein an nth one of the stages (where n is a natural number) comprises:
a carry output switching device controlled by a voltage applied to a set node and connected between a carry clock transfer line, the carry clock transfer line transferring any one of i carry clock pulses having different phases (where i is a natural number greater than 1), and a carry output terminal of the nth stage;
a scan output switching device controlled by the voltage applied to the set node and connected between a scan clock transfer line, the scan clock transfer line transferring any one of j scan clock pulses having different phases (where j is a natural number greater than 1), and a scan output terminal of the nth stage; and
a stabilization switching device controlled by any one of the i carry clock pulses overlapping with the scan clock pulse applied to the scan output switching device and connected between a carry output terminal of an (n−p)th one of the stages (where p is a natural number less than n) and the set node or between a start transfer line, the start transfer line transferring a start pulse, and the set node.

2. The shift register according to claim 1, wherein the carry pulse supplied to the stabilization switching device of the nth stage through the carry output terminal of the (n−p)th stage is generated based on the carry clock pulse supplied to the stabilization switching device.

3. The shift register according to claim 1, wherein the start pulse supplied to the stabilization switching device of the nth stage through the start transfer line is synchronized with the carry clock pulse supplied to the stabilization switching device.

4. The shift register according to claim 1, wherein:
each of the i carry clock pulses comprises a plurality of carry impulses, the carry impulses being periodically output; and
each of the j scan clock pulses comprises a plurality of scan impulses, the scan impulses being periodically output,
wherein the j scan clock pulses are output without overlap in their pulse widths,
wherein each scan impulse in a scan clock pulse output in the kth order (where k is any one of natural numbers from 1 to j), among the j scan clock pulses, overlaps with a carry impulse output in the (jm+k)th order (where m is a natural number including 0), among the carry impulses in the i carry clock pulses.

5. The shift register according to claim 4, wherein each of the carry impulses has a duration longer than that of each of the scan impulses.

6. The shift register according to claim 4, wherein, for an ath one of the carry impulses and a bth one of the scan impulses overlapping with each other, the bth scan impulse has a rising edge positioned between a rising edge and a falling edge of the ath carry impulse.

7. The shift register according to claim 6, wherein the bth scan impulse has a falling edge positioned between the rising edge of the bth scan impulse and a rising edge of an (a+1)th one of the carry impulses.

8. The shift register according to claim 1, wherein the nth stage further comprises:
a node controller that controls a voltage at a reset node based on the voltage at the set node;
a carry discharging switching device controlled by the voltage at the reset node and connected between the carry output terminal of the nth stage and a first discharging voltage line, the first discharging voltage line transferring a first discharging voltage; and
a scan discharging switching device controlled by the voltage at the reset node and connected between the scan output terminal of the nth stage and a second discharging voltage line, the second discharging voltage line transferring a second discharging voltage.

9. The shift register according to claim 8, wherein the node controller comprises an inverter that controls the voltage at the reset node based on the voltage at the set node such that the voltage at the set node and the voltage at the reset node have opposite logics.

10. The shift register according to claim 9, wherein the inverter comprises:
a first inverting switching device controlled by a high voltage from a high voltage line and connected between the high voltage line and the reset node; and
a second inverting switching device controlled by the voltage at the set node and connected between the reset node and a low voltage line, the low voltage line transferring a low voltage.

11. The shift register according to claim 9, wherein the inverter comprises:
a first inverting switching device controlled by an external control signal and connected between a high voltage line, the high voltage line transferring a high voltage, and the reset node; and
a second inverting switching device controlled by the voltage at the set node and connected between the reset node and a low voltage line, the low voltage line transferring a low voltage.

12. The shift register according to claim 9, wherein the inverter comprises:
a first inverting switching device controlled by an external control signal and connected between a high voltage line, the high voltage line transferring a high voltage, and a common node;
a second inverting switching device controlled by the voltage at the set node and connected between the common node and a low voltage line, the low voltage line transferring a low voltage;
a third inverting switching device controlled by a voltage at the common node and connected between the high voltage line and the reset node; and
a fourth inverting switching device controlled by the voltage at the set node and connected between the reset node and the low voltage line.

13. The shift register according to claim 9, wherein the inverter comprises:
a first inverting switching device controlled by a high voltage from a high voltage line and connected between the high voltage line and a common node;
a second inverting switching device controlled by the voltage at the set node and connected between the common node and a low voltage line, the low voltage line transferring a low voltage;
a third inverting switching device controlled by a voltage at the common node and connected between the high voltage line and the reset node; and
a fourth inverting switching device controlled by the voltage at the set node and connected between the reset node and the low voltage line.

14. The shift register according to claim 9, wherein the inverter comprises:
a first inverting switching device controlled by the voltage at the set node and connected between the reset node and a low voltage line, the low voltage line transferring a low voltage;
a second inverting switching device controlled by the voltage at the reset node and connected between the set node and the carry output terminal of the nth stage or between the set node and the scan output terminal of the nth stage; and
an inverting capacitor connected between a carry clock transfer line transferring any one of the i carry clock pulses and the reset node.

15. The shift register according to claim 1, wherein the nth stage further comprises:
a carry discharging switching device controlled by any one of the i carry clock pulses and connected between the carry output terminal of the nth stage and a first discharging voltage line, the first discharging voltage line transferring a first discharging voltage; and
a scan discharging switching device controlled by any one of the i carry clock pulses and connected between the scan output terminal of the nth stage and a second discharging voltage line, the second discharging voltage line transferring a second discharging voltage.

16. The shift register according to claim 1, wherein the nth stage further comprises a first switching device controlled by the voltage at the set node and connected between the set node and a gate electrode of the carry output switching device.

17. The shift register according to claim 1, wherein the nth stage further comprises a second switching device controlled by the carry pulse from the (n−p) th stage and connected between a reset node of the nth stage and a third discharging voltage line, the third discharging voltage line transferring a third discharging voltage.

18. The shift register according to claim 1, wherein the nth stage comprises:
a node controller that controls a voltage at a reset node based on the voltage at the set node;
a carry discharging switching device controlled by any one of the i carry clock pulses and connected between the carry output terminal of the nth stage and a first discharging voltage line, the first discharging voltage line transferring a first discharging voltage; and
a scan discharging switching device controlled by the voltage at the reset node and connected between the scan output terminal of the nth stage and a second discharging voltage line, the second discharging voltage line transferring a second discharging voltage.

19. The shift register according to claim 1, wherein the nth stage comprises:
   a node controller that controls a voltage at a reset node based on the voltage at the set node;
   a carry discharging switching device controlled by the voltage at the reset node and connected between the carry output terminal of the nth stage and a first discharging voltage line, the first discharging voltage line transferring a first discharging voltage; and
   a scan discharging switching device controlled by any one of the i carry clock pulses and connected between the scan output terminal of the nth stage and a second discharging voltage line, the second discharging voltage line transferring a second discharging voltage.

20. The shift register according to claim 1, wherein the nth stage further comprises a fourth switching device controlled by the carry pulse from the (n−p)th stage and connected between a charging voltage line, the charging voltage line transferring a charging voltage, and the set node.

21. The shift register according to claim 1, wherein the nth stage further comprises a fifth switching device controlled by the carry pulse from an (n+q)th one of the stages (where q is a natural number) and connected between the set node and a fifth discharging voltage line, the fifth discharging voltage line transferring a fifth discharging voltage.

22. The shift register according to claim 1, wherein the nth stage further comprises a first output capacitor connected between the set node and the carry output terminal of the nth stage.

23. The shift register according to claim 1, wherein the nth stage further comprises a second output capacitor connected between the set node and the scan output terminal of the nth stage.

* * * * *